(12) United States Patent
Khajeh et al.

(10) Patent No.: US 11,950,512 B2
(45) Date of Patent: Apr. 2, 2024

(54) THIN-FILM ACOUSTIC IMAGING SYSTEM FOR IMAGING THROUGH AN EXTERIOR SURFACE OF AN ELECTRONIC DEVICE HOUSING

(71) Applicant: Apple Inc., Cupertino, CA (US)

(72) Inventors: Ehsan Khajeh, Los Gatos, CA (US);
Aaron S. Tucker, Redwood City, CA (US); Andrew W. Joyce, San Jose, CA (US); Brian M. King, Saratoga, CA (US); Giovanni Gozzini, Berkeley, CA (US); Jason S. Griesbach, Sausalito, CA (US); Marcus C. Yip, San Carlos, CA (US); Mohammad Yeke Yazdandoost, Santa Clara, CA (US); Gordon S. Franza, Rockledge, FL (US); Henry H. Yang, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 584 days.

(21) Appl. No.: 17/210,023

(22) Filed: Mar. 23, 2021

(65) Prior Publication Data
US 2021/0296562 A1    Sep. 23, 2021

Related U.S. Application Data

(60) Provisional application No. 62/993,632, filed on Mar. 23, 2020.

(51) Int. Cl.
*H10N 30/87* (2023.01)
*H10N 30/00* (2023.01)
*H10N 30/20* (2023.01)

(52) U.S. Cl.
CPC ..... *H10N 30/878* (2023.02); *H10N 30/10516* (2023.02); *H10N 30/2047* (2023.02)

(58) Field of Classification Search
CPC .......... H10N 30/878; H10N 30/10516; H10N 30/2047; B06B 2201/70; B06B 2201/56;
(Continued)

(56) References Cited

U.S. PATENT DOCUMENTS

| 4,729,128 A | 3/1988 | Grimes |
| 5,162,618 A | 11/1992 | Knowles |

(Continued)

FOREIGN PATENT DOCUMENTS

| KR | 100914026 B1 * | 8/2009 |
| WO | WO 94/002911 | 2/1994 |
| WO | WO 05/103872 | 11/2005 |

OTHER PUBLICATIONS

Bicz et al., "Ultrasonic sensor for fingerprints recognition," Proceedings of SPIE 2634, Optoelectronic and Electronic Sensors, Jun. 30, 1995, doi: 10-1117/12.213142, 9 pages.

(Continued)

*Primary Examiner* — J. San Martin
*Assistant Examiner* — Jaydi San Martin
(74) *Attorney, Agent, or Firm* — Brownstein Hyatt Farber Schreck, LLP

(57) ABSTRACT

An acoustic imaging system coupled to a sensing plate to define an imaging surface. The acoustic imaging system includes an array of piezoelectric acoustic transducers coupled to the sensing plate opposite the imaging surface and formed using a thin-film manufacturing process over an application-specific integrated circuit that, in turn, is configured to leverage the array of piezoelectric actuators to generate an image of an object at least partially wetting to the imaging surface.

25 Claims, 13 Drawing Sheets

(58) Field of Classification Search
CPC ... B06B 2201/20; B06B 1/025; B06B 1/0629; B06B 1/068; B06B 1/067
See application file for complete search history.

(56) References Cited

U.S. PATENT DOCUMENTS

| | | | |
|---|---|---|---|
| 5,381,696 A | 1/1995 | Ichinose et al. |
| 5,515,298 A | 5/1996 | Bicz |
| 5,589,636 A | 12/1996 | Bicz |
| 5,719,950 A | 2/1998 | Osten |
| 5,886,452 A | 3/1999 | Toda |
| 6,091,406 A | 7/2000 | Kambara |
| 6,159,149 A | 12/2000 | Erikson |
| 6,164,135 A | 12/2000 | Bicz |
| 6,720,712 B2 | 4/2004 | Scott |
| 7,032,454 B2 | 4/2006 | Amano |
| 7,400,750 B2 | 7/2008 | Nam |
| 7,449,821 B2 | 11/2008 | Dausch |
| 7,458,268 B2 | 12/2008 | Schneider et al. |
| 7,497,120 B2 | 3/2009 | Schneider et al. |
| 7,568,391 B2 | 8/2009 | Schneider et al. |
| 7,656,932 B2 | 2/2010 | Durand |
| 7,667,374 B2 | 2/2010 | Aono et al. |
| 7,734,435 B2 | 6/2010 | Thomas et al. |
| 7,739,912 B2 | 6/2010 | Schneider et al. |
| 7,770,456 B2 | 8/2010 | Stevenson et al. |
| 8,047,995 B2 | 11/2011 | Wakabayashi et al. |
| 8,054,203 B2 | 11/2011 | Breed et al. |
| 8,085,998 B2 | 12/2011 | Setlak et al. |
| 8,095,328 B2 | 1/2012 | Thomas et al. |
| 8,179,678 B2 | 5/2012 | Yamashita et al. |
| 8,201,739 B2 | 6/2012 | Schneider et al. |
| 8,335,356 B2 | 12/2012 | Schmitt |
| 8,345,508 B2 | 1/2013 | Wodnicki et al. |
| 8,508,103 B2 | 8/2013 | Schmitt et al. |
| 8,536,465 B2 | 9/2013 | Hagiwara et al. |
| 8,576,202 B2 | 11/2013 | Tanaka et al. |
| 8,601,876 B2 | 12/2013 | Schneider et al. |
| 8,617,078 B2 | 12/2013 | Machida et al. |
| 8,666,126 B2 | 3/2014 | Lee et al. |
| 8,692,812 B2 | 4/2014 | Hecht |
| 8,724,859 B2 | 5/2014 | Schneider et al. |
| 8,743,091 B2 | 6/2014 | Bernstein |
| 8,781,180 B2 | 7/2014 | Schneider et al. |
| 8,791,792 B2 | 7/2014 | Benkley, III |
| 8,982,089 B2 | 3/2015 | Lim |
| 9,044,171 B2 | 6/2015 | Venkatraman et al. |
| 9,056,082 B2 | 6/2015 | Liautaud et al. |
| 9,100,034 B2 | 8/2015 | Oshima |
| 9,132,693 B2 | 9/2015 | Klootwijk et al. |
| 9,170,668 B2 | 10/2015 | Schneider et al. |
| 9,201,546 B2 | 12/2015 | Son et al. |
| 9,275,625 B2 | 3/2016 | Kim et al. |
| 9,323,393 B2 | 4/2016 | Djordjev et al. |
| 9,360,365 B2 | 6/2016 | Tsuchimoto |
| 9,465,972 B2 | 10/2016 | Chung et al. |
| 9,568,315 B2 | 2/2017 | Naoka, II et al. |
| 9,582,705 B2 | 2/2017 | Du et al. |
| 9,597,014 B2 | 3/2017 | Venkatraman et al. |
| 9,607,203 B1 | 3/2017 | Yazdandoost et al. |
| 9,613,246 B1 | 4/2017 | Gozzini et al. |
| 9,747,988 B2 | 8/2017 | Yazdandoost et al. |
| 9,750,451 B2 | 9/2017 | Masson et al. |
| 9,778,193 B2 | 10/2017 | Vacca |
| 9,824,254 B1 | 11/2017 | Yazdandoost et al. |
| 9,857,872 B2 | 1/2018 | Terlizzi et al. |
| 9,904,836 B2 | 2/2018 | Yazdandoost et al. |
| 9,927,926 B2 | 3/2018 | Peng |
| 9,952,095 B1 | 4/2018 | Hotelling et al. |
| 9,979,955 B1 | 5/2018 | Guo |
| 9,984,271 B1 | 5/2018 | King et al. |
| 10,036,734 B2 | 7/2018 | Fennell et al. |
| 10,061,963 B2 | 8/2018 | Yazdandoost et al. |
| 10,133,904 B2 | 11/2018 | Yazdandoost et al. |
| 10,198,610 B1 | 2/2019 | Yousefpor et al. |
| 10,203,816 B2 | 2/2019 | Nelson et al. |
| 10,217,045 B2 | 2/2019 | Lal et al. |
| 10,241,223 B2 | 3/2019 | Jin et al. |
| 10,275,633 B1 | 4/2019 | Yousefpor et al. |
| 10,275,638 B1 | 4/2019 | Yousefpor et al. |
| 10,324,065 B2 | 6/2019 | Lee et al. |
| 10,325,136 B1 | 6/2019 | Yeke Yazdandoost et al. |
| 10,366,269 B2 | 7/2019 | Lu et al. |
| 10,430,631 B2 | 10/2019 | Lu et al. |
| 10,503,948 B2 | 12/2019 | Kitchens, II et al. |
| 10,713,823 B2 | 7/2020 | Teshigawara et al. |
| 2003/0102777 A1 | 6/2003 | Kuniyasu et al. |
| 2003/0109993 A1 | 6/2003 | Peat et al. |
| 2004/0140735 A1 | 7/2004 | Scott et al. |
| 2004/0264746 A1 | 12/2004 | Polcha |
| 2006/0196271 A1 | 9/2006 | Jancsik et al. |
| 2008/0142571 A1 | 6/2008 | Yokozuka et al. |
| 2008/0175450 A1 | 7/2008 | Scott |
| 2010/0207485 A1* | 8/2010 | Dirksen ............... B06B 1/0292 310/300 |
| 2011/0115333 A1* | 5/2011 | Ezaki ................... B06B 1/0292 310/300 |
| 2012/0044299 A1* | 2/2012 | Winger ................. B41J 2/1606 428/411.1 |
| 2012/0092026 A1 | 4/2012 | Liautaud et al. |
| 2013/0278111 A1 | 10/2013 | Sammoura et al. |
| 2014/0359757 A1 | 12/2014 | Sezan et al. |
| 2015/0053006 A1 | 2/2015 | DeCoux et al. |
| 2015/0358740 A1 | 12/2015 | Tsai et al. |
| 2016/0092714 A1* | 3/2016 | Yazdandoost ........... G06F 21/32 345/177 |
| 2016/0246396 A1 | 8/2016 | Dickinson et al. |
| 2017/0012142 A1* | 1/2017 | Lin .................... G06V 40/1329 |
| 2017/0053151 A1 | 2/2017 | Yazdandoost et al. |
| 2018/0238734 A1 | 8/2018 | Hotelling et al. |
| 2018/0314871 A1* | 11/2018 | He ....................... B06B 1/0607 |
| 2022/0327856 A1* | 10/2022 | Franza ................. B06B 1/0215 |

OTHER PUBLICATIONS

Gumienny et al., "Synthetic aperture acoustic microscope for evaluation of finger tip peripheral skin structure," Proceedings of SPIE, Optical Biophysics, Mar. 30, 1995, doi: 10.1117/12.205999, 5 pages.

Definition of Generate, Merriam-Webster, https://www.merriam-webster.com/dictionary/generate, retrieved Dec. 28, 2020, 2 pages.

* cited by examiner

THIN-FILM ACOUSTIC IMAGING SYSTEM FOR IMAGING THROUGH AN EXTERIOR SURFACE OF AN ELECTRONIC DEVICE HOUSING

CROSS-REFERENCE TO RELATED APPLICATION

This application is a nonprovisional of and claims the benefit under 35 U.S.C. 119(e) of U.S. Provisional Patent Application No. 63/993,632, filed Mar. 23, 2020, the contents of which are incorporated herein by reference as if fully disclosed herein.

TECHNICAL FIELD

Embodiments described herein relate to digital imaging systems and, in particular, to acoustic imaging systems configured for use through an exterior surface of a portable electronic device, such as a display surface or a housing surface.

BACKGROUND

An acoustic imaging system can be used to capture an image of an object at least partially wetting to a surface, often referred to as an "imaging surface." Certain conventional acoustic imaging systems are implemented with a two-dimensional array of microelectromechanical piezoelectric actuators that (1) generate an acoustic pulse directed toward the imaging surface in response to stimulus from control electronics and/or (2) output a voltage signal upon receiving reflections of those acoustic pulses resulting from impedance mismatch boundaries defined by contours of the object wetting to the imaging surface.

However, impedance matching a conventional acoustic imaging system to high impedance materials, such as glass or metal, is exceptionally challenging. As a result, conventional acoustic imaging systems incorporated into electronic devices (e.g., to image a user's fingerprint through a display) typically are power inefficient, exhibit low signal-to-noise ratios even in ideal operating conditions, and require backing layers and/or vacuum cavities that increase manufacturing cost and complexity and reduce tolerances.

SUMMARY

Embodiments described herein take the form of an acoustic imaging system including at least an adhesive layer (e.g., an epoxy) configured to acoustically couple to a sensing plate. The system typically includes a first electrode layer bonded to the adhesive layer, a piezoelectric actuator layer (e.g., aluminum nitride, zinc oxide, and so on) below the first electrode layer, and a second electrode layer below the piezoelectric layer. The second electrode layer is typically aligned with the first electrode layer. As a result of this structure, the first and second electrode layers can be leveraged to generate an electric field through the piezoelectric actuator layer to cause the piezoelectric actuator layer to expand or contract.

The system further includes a metalloid oxide layer (e.g., silicon dioxide) encapsulating the second electrode against the piezoelectric actuator layer. Each of these described layers can be formed atop and/or otherwise mechanically or conductively coupled to an application-specific integrated circuit formed below (and/or coupled to) the metalloid oxide layer. In these examples, the application-specific integrated circuit conductively coupled to the first electrode layer and the second electrode layer.

As a result of this described construction and related equivalents, an acoustic imaging system such as described herein can be manufactured using thin-film manufacturing processes and techniques which, in turn, can reduce manufacturing complexity and cost typically associated with manufacturing microelectromechanical piezoelectric actuator arrays including vacuum cavity backing layers. In addition, due to solid state thin-film construction, an acoustic imaging system described herein exhibits a higher acoustic impedance than conventional vacuum-cavity (and/or other flexible backing) designs. As a result of increased acoustic impedance, an acoustic imaging system such as described herein can be more efficiently coupled to sensing plates having higher acoustic impedances, such as sensing plates made from metal, glass, or ceramic. In other, non-liming, words, an acoustic imaging system such as described herein may impedance match more closely to materials more typically associated with consumer electronic devices, such as metal, glass, or ceramic.

Related and additional embodiments may include a configuration in which a piezoelectric actuator layer includes an array of physically separated piezoelectric actuators. The array may be disposed in a grid, a lattice, or any other suitable pattern whether regular and repeating or irregular and not repeating.

Related and additional embodiments may include a configuration in which the first electrode layer includes molybdenum disposed on a surface of the piezoelectric actuator layer and/or the second electrode layer includes aluminum disposed on a second surface the piezoelectric actuator layer, the second surface opposite the first surface. In such examples, either or both the first electrode layer or the second electrode layer can be disposed to a thickness of less than or equal to 5 µm. In one specific implementation, the first and/or second electrode layers are disposed to a thickness of approximately 0.1 µm. In these examples, the piezoelectric actuator layer and/or the adhesive layer may be formed/disposed to a thickness of less than or equal to 5 µm. In one specific implementation, the actuator layer and/or the adhesive layer may be formed to a thickness of approximately 3 µm.

Embodiments described herein take the form of an acoustic imaging system configured to adhere to an interior surface of a portable electronic device. The acoustic imaging system can include elements such as, but not limited to: an adhesive layer configured to acoustically couple to the interior surface; a high acoustic impedance stack; and an application-specific integrated circuit positioned below and coupled to the high acoustic impedance stack.

The high acoustic impedance stack can include: an actuator layer with an array of piezoelectric actuators; an array of electrode pairs, each associated with a respective piezoelectric actuator of the actuator layer, each electrode pair including at least a first electrode disposed between the adhesive layer a top surface of the respective piezoelectric actuator; and a second electrode disposed on a bottom surface of the respective piezoelectric actuator opposite and parallel to the first electrode; and a metalloid oxide layer (also referred to as an encapsulation layer) encapsulating the second array of electrodes against the second surface of the actuator layer.

In these examples, the application-specific integrated circuit can be formed/disposed below and coupled to the metalloid oxide layer of the high acoustic impedance stack. The application-specific integrated circuit in these and related examples can be conductively or capacitively coupled to the first array of electrodes and the second array of electrodes to as to apply voltage signals thereto and to receive voltage signals therefrom.

Related and additional embodiments may include a configuration in which the application-specific integrated circuit is configured to select at least one electrode pair and generate a voltage between the first electrode of the selected electrode pair and the second electrode of the selected electrode pair to cause the piezoelectric actuator layer to expand or contract and, in response, generate an acoustic pulse with a selected center frequency (e.g., greater than 40 MHz, such as 50 MHz). The voltage may be a wavelet pulse having the selected center frequency, bandwidth, and/or spectrum shape.

Related and additional embodiments may include a configuration in which the piezoelectric actuator is/includes a d33 piezoelectric crystal material configured to expand or contract along a direction normal to the first electrode layer and the second electrode layer.

Further embodiments described herein take the form of an electronic device with an acoustic imaging system. The electronic device can include at least a housing and an acoustic imagining system, such as described herein.

As with other described embodiments and equivalents thereof, an acoustic imaging system can include at least: an adhesive layer configured to acoustically couple to an internal surface of the housing (thereby defining a portion of an external surface of the housing opposite the internal surface as an imaging surface); a first electrode layer bonded to the adhesive layer; a piezoelectric actuator layer below the first electrode layer, a second electrode layer below the piezoelectric layer aligned with the first electrode layer to generate an electric field through the piezoelectric actuator layer; a metalloid oxide layer (e.g., silicon dioxide) encapsulating the second electrode against the piezoelectric actuator layer; and an application-specific integrated circuit formed below and coupled to the metalloid oxide layer.

As with other examples provided herein, the application-specific integrated circuit can be configured to conductively coupled to the first electrode layer and the second electrode layer and to apply a first voltage signal (e.g., wavelet, chirp signal, and so on) between the first electrode layer and the second electrode layer to cause an acoustic pulse to be generated by the piezoelectric actuator layer. In such examples, the acoustic pulse propagates toward the imaging surface (through the housing), from which it may at least partially reflect. Thereafter, such reflections may be received by the application-specific integrated circuit as a second voltage signal (from at least one of the first electrode layer or the second electrode layer). The second voltage signal may be used to generate an image of an object at least partially wetting to the imaging surface, such as a fingerprint of a finger of a user touching the imaging surface (i.e., an external surface of the electronic device).

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
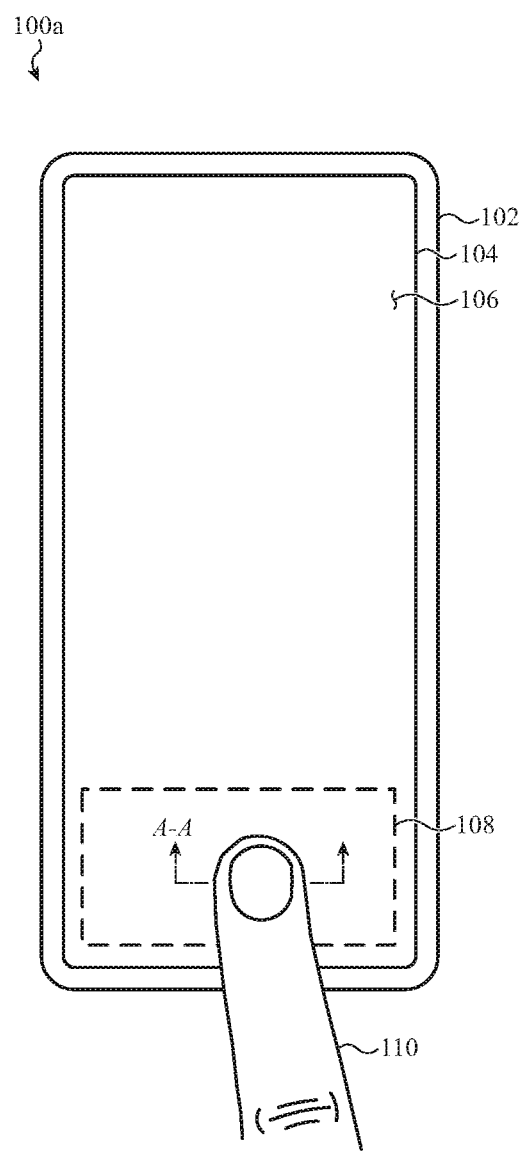
FIG. 1A depicts an example electronic device incorporating a thin-film acoustic imaging system defining an imaging surface above an active display area of the electronic device, such as described herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Similarly, certain accompanying figures include vectors, rays, traces and/or other visual representations of one or more example paths—which may include reflections, refractions, diffractions, and so on, through one or more mediums—that may be taken by, or may be presented to, represent one or more propagating waves of mechanical energy (herein, "acoustic energy") originating from one or more acoustic transducers or other mechanical energy sources shown or, in some cases, omitted from, the accompanying figures. It is understood that these simplified visual representations of acoustic energy are provided merely to facilitate an understanding of the various embodiments described herein and, accordingly, may not necessarily be presented or illustrated to scale or with angular precision or accuracy, and, as such, are not intended to indicate any preference or requirement for an illustrated embodiment to receive, emit, reflect, refract, focus, and/or diffract acoustic energy at any particular illustrated angle, orientation, polarization, color, or direction, to the exclusion of other embodiments described or referenced herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to acoustic imaging systems and, in particular, to acoustic imaging systems incorporated into electronic devices leveraged to capture images of fingerprints of users of those electronic devices.

In many implementations, an acoustic imaging system, such as described herein, is positioned behind a display of an electronic device to facilitate through-display imaging of a user's fingerprint when that user touches the display. In other implementations, an acoustic imaging system, such as described herein, can be positioned relative to a housing of a hand-held electronic device to facilitate through-housing imaging of a user's fingerprint when that user handles the hand-held electronic device, such as by grasping a sidewall surface of the housing. In yet other implementations, an acoustic imaging system, such as described herein, can be positioned relative to a physical input device, such as a button (e.g., a power button) or key (e.g., of a keyboard), to facilitate imaging of a user's fingerprint when that user interacts with the physical input device. In still other examples, an acoustic imaging system, such as described herein, can be incorporated into any suitable location of any suitable electronic device and leveraged for any suitable imaging purpose, whether biometric or otherwise. These preceding examples are not exhaustive.

For simplicity of description, embodiments described herein reference an acoustic imaging system including a two-dimensional array of thin-film piezoelectric actuators coupled to a "sensing plate." A sensing plate, such as described herein, exhibits a generally rectangular cross-sectional profile defined by two substantially parallel opposing surfaces. In such embodiments, the two-dimensional array of thin-film piezoelectric actuators is adhered, via a thin layer of impedance-matching adhesive (e.g., micrometer scale, for example 1-5 µm) to one of the sensing plate surfaces, thereby defining the other sensing plate surface as an "imaging surface." As a result of the thin-film architecture(s) described herein, a requirement for a backing layer (such as a vacuum cavity, required of conventional microelectromechanical piezoelectric actuators) is eliminated and, thus, the acoustic impedance of the two-dimensional array of thin-film piezoelectric actuators can be increased relative to conventional microelectromechanical designs. As a result of increased acoustic impedance of the thin-film piezoelectric actuators, an acoustic imaging system such as described herein can be impedance matched to materials with high acoustic impedance, such as glass or metal, substantially more effectively than conventional acoustic imaging designs. In a more general, non-limiting, phrasing, an acoustic imaging system such as described herein can be used to capture images of objects wetting to imaging surfaces defined by high-impedance materials, exhibiting increased power efficiency and increased signal-to-noise ratio. As a result, an acoustic imaging system such as described herein can be leveraged by, as one example, a portable electronic device to capture an image of a user's fingerprint through glass and/or metal, such as may be used to form a housing of the electronic device.

As a result of these described constructions, one or more of the thin-film piezoelectric actuators can generate an acoustic pulse toward the imaging surface through a body or bulk of the sensing plate. As the propagating acoustic pulse reaches the imaging surface, which defines an acoustic boundary, a portion of the acoustic pulse may reflect back towards the array and a portion of the acoustic pulse may traverse the acoustic boundary and propagate into a medium interfacing the imaging surface (e.g., air, an object wetting to the imaging surface, and so on). The acoustic imaging system, in these and other related examples, can quantify properties of said reflections by sampling voltages output from one or more thin-film piezoelectric transducers of the two-dimensional array. In particular, output voltage samples over time may correspond to amplitude of the reflections, which, in turn, can be correlated to the acoustic impedance of the object (and, in particular, the acoustic impedance mismatch between the sensing plate and the object) wetting to the imaging surface.

As a result of this arrangement, the acoustic imaging system can be leveraged to generate a two-dimensional image of acoustic impedance mismatches defined by contours of an object at least partially wetted to the imaging surface. For example, the acoustic imaging system may cause individual thin-file piezoelectric transducers to generate acoustic pulses (e.g., by driving the transducers with a wavelet voltage signal) and receive reflections resulting therefrom in a sequence or pattern (e.g., row by row, column by column, transducer by transducer, serpentine pattern, and so on). In other cases, multiple transducers can be driven or stimulated by control electronics according to a specific timing pattern (e.g., beamforming) such that multiple acoustic pulses generated by multiple transducers constructively interfere at a target location of the imaging surface. These preceding examples are not exhaustive; it may be appreciated that a two-dimensional array of piezoelectric transducers such as described herein can be leveraged in a number of suitable ways to generate an image, such as described herein.

Further to the foregoing, a thin-film piezoelectric transducer array, such as described herein, can be formed directly atop, over, or an application-specific integrated circuit configured to stimulate selected piezoelectric transducers of the array with a voltage to cause each stimulated piezoelectric transducer to expand along an axis parallel to an electric field within that transducer induced by the stimulus voltage. This operation is referred to herein as "driving" a piezoelectric transducer configured in an "integration mode." In addition, an application-specific integrated circuit is configured to receive and sample, from selected piezoelectric transducers of the array, an output voltage resulting from compression or expansion of that respective piezoelectric transducer. This operation is referred to herein as "sensing" with a piezoelectric transducer configured in a "sense mode."

Similarly, it is appreciated that a sensing plate, such as described herein, may in some embodiments form a part of an electronic device display or housing. In such examples, the imaging surface can be any suitable external surface of an electronic device, such as an external surface above a display or an external surface of a housing sidewall.

As a result of this construction, the application-specific integrated circuit can initiate a drive operation with one or more piezoelectric transducers configured in an integration mode to generate one or more acoustic waves These foregoing and other embodiments are discussed below with reference to FIGS. 1A-7. However, those skilled in the art will readily appreciate that the detailed description given herein with respect to these figures is for explanation only and should not be construed as limiting.

Figure 1B:
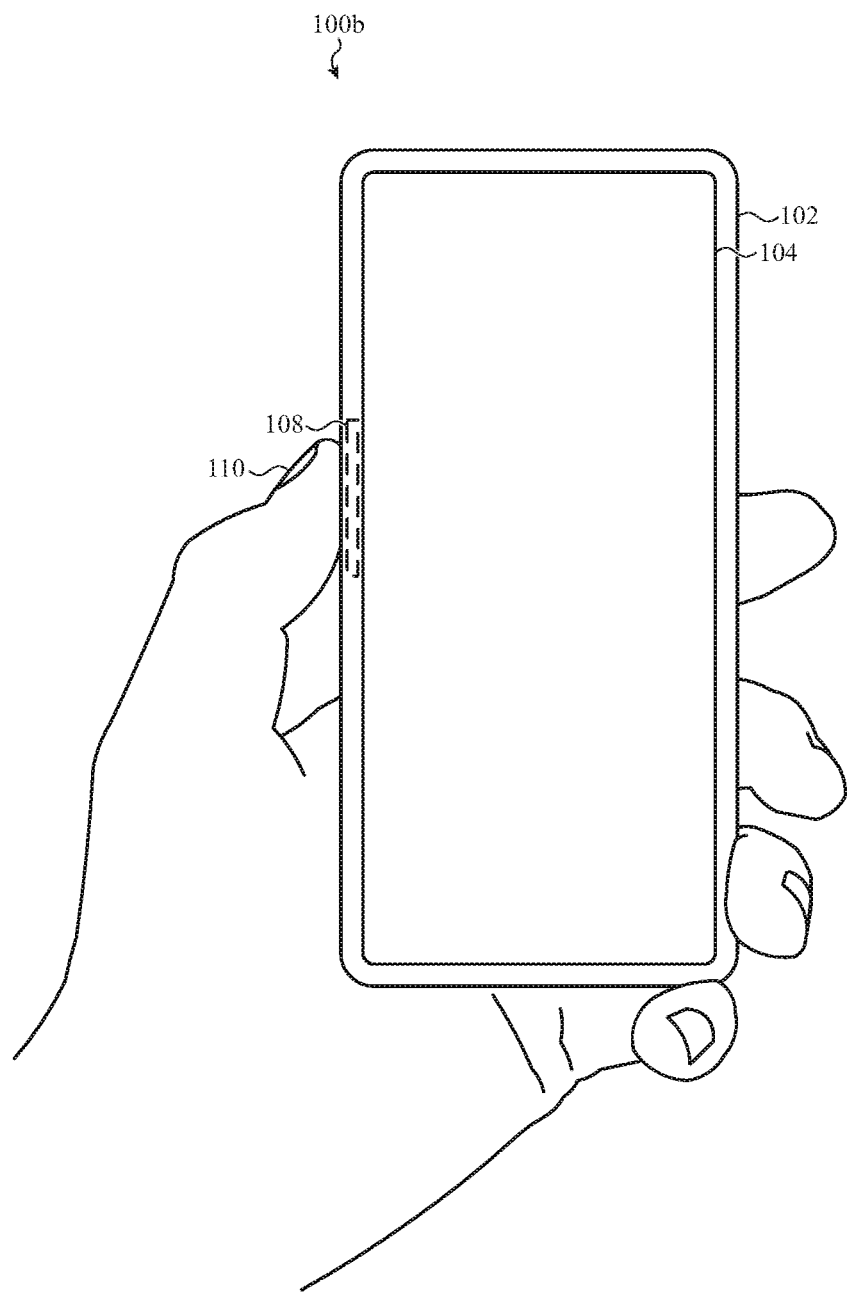
FIG. 1B depicts an example electronic device incorporating a thin-film acoustic imaging system defining an imaging surface along a housing sidewall of the electronic device, such as described herein.
Figure 1C:
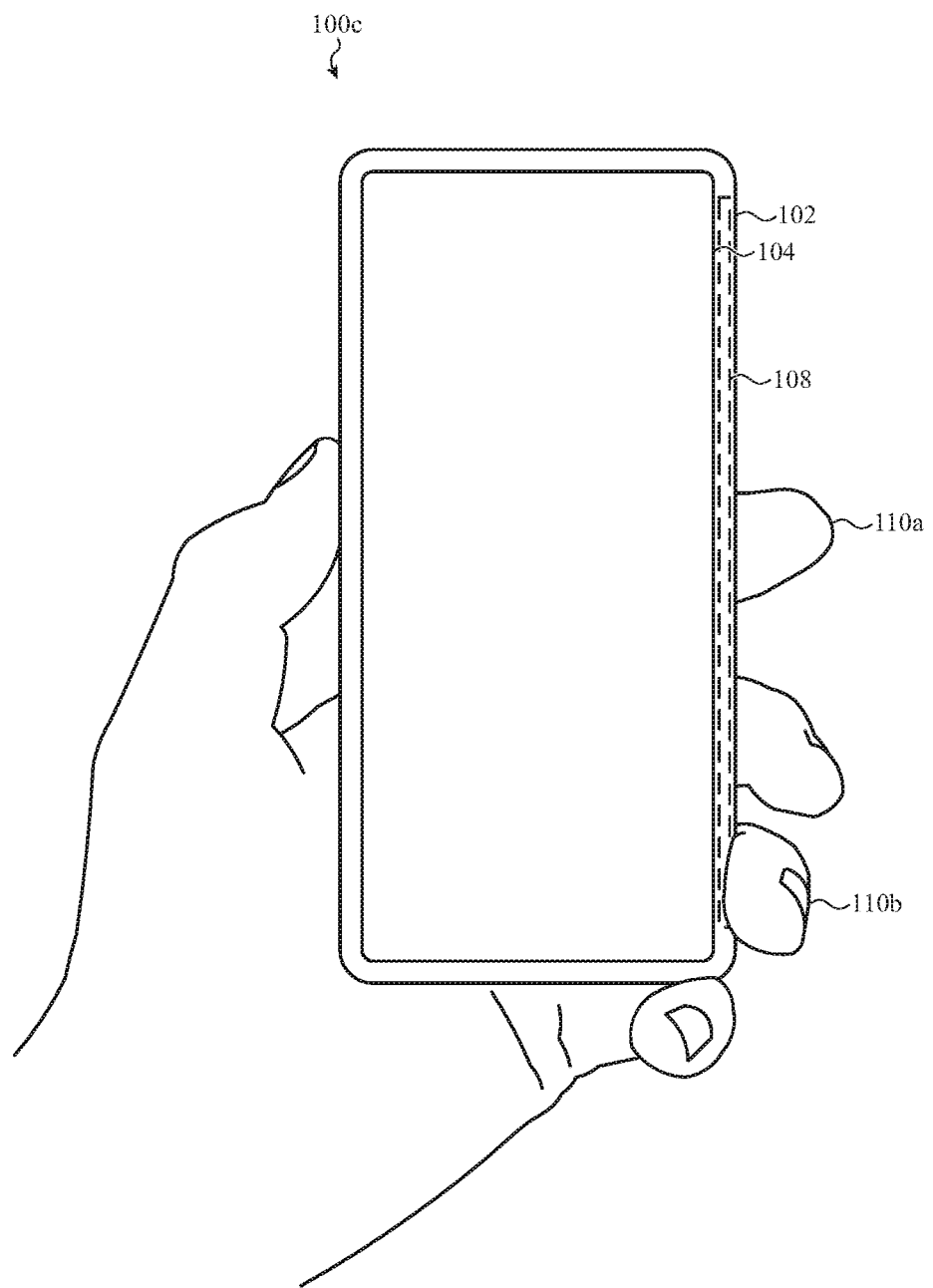
FIG. 1C depicts an example electronic device incorporating a thin-film acoustic imaging system defining an imaging surface along another housing sidewall of the electronic device, such as described herein.

Generally and broadly, FIGS. 1A-1C depict example electronic devices that can incorporate an acoustic imaging system such as described herein. In particular, as noted above, embodiments described herein relate to acoustic imaging systems that resolve an image of an object engaging an imaging surface (also referred to as an input surface) of an electronic device by generating acoustic pulses (one or more; in some examples constructively interfering via beamforming and/or phased array excitation techniques) with piezoelectric acoustic transducers. The acoustic pulses propagate through a portion of the housing of the electronic device (more generally referred to herein as the "sensing plate") toward the imaging surface and, thereafter, the acoustic imaging system samples voltage signals produced by the same or different piezoelectric acoustic transducers to quantify reflections of the acoustic pulses from the imaging surface. As may be appreciated by a person of skill in the art, amplitudes of reflections from the imaging surface correspond to acoustic impedance mismatch boundaries at the imaging surface; some objects wetting to the imaging surface may absorb more acoustic pulse energy (i.e., objects having an acoustic impedance close to that of the sensing plate) than other objects wetting to the imaging surface (i.e., objects having an acoustic impedance substantively different from that of the sensing plate). By iteratively generating acoustic pulses and characterizing reflections resulting therefrom, an acoustic imaging system, such as described herein, can be leveraged to generate a two-dimensional image the contrast of which corresponds to acoustic impedance mismatch boundaries/contours of one or more objects wetting to the imaging surface.

In one particular example, an acoustic imaging system may be used to generate an image of a fingerprint wetting to an imaging surface. Portions of that fingerprint that directly wet to the imaging surface (e.g., ridges) may reflect a different quantity of acoustic energy than portions of that fingerprint that do not wet to the imaging surface (e.g., valleys). As such, different acoustic impedance mismatches are associated with ridges and valleys of a user's fingerprint and, by mapping acoustic impedance mismatch at different locations of the imaging surface, a two-dimensional image of the user's fingerprint can be generated which, in turn, can be computer readable and may be leveraged by the electronic device to perform a particular function, such as authentication or identification or a particular user.

For simplicity of description, many embodiments described herein are configured to operate as (or with) a biometric sensor that obtains and analyzes an image of a user's fingerprint when the user touches a display of an electronic device with one or more fingers. It is appreciated, however, that although many embodiments are described herein with reference to obtaining an image of a user's fingerprint, the various systems and methods described herein can be used to perform other operations, or to obtain non-fingerprint information, such as, but not limited to: obtaining an image of a palm; obtaining an image of an ear or cheek; determining the location of a stylus on an imaging surface of an electronic device; determining a physiological characteristic of a user such as heart rate or blood oxygenation; determining characteristics of a non-imaging surface; determining the force with which a user touches an imaging surface; determining the location at which a user touches an imaging surface; determining a user touch or force input to an imaging surface; and so on. Accordingly, it may be appreciated that the various systems and methods presented below are merely examples and that other embodiments, systems, methods, techniques, apparatuses, and combinations thereof are contemplated in view of the disclosure provided below.

As used herein, the term "image" and the phrase "resolved image" refers to a two-dimensional collection of pixels, the coordinates of which correspond to local surface characteristics of a sensing plate (or a portion thereof) that may change as a result of a user's fingertip when the fingertip makes physical contact with the sensing plate at that location. The area over which a user's fingertip contacts the sensing plate can be referred to herein as the "contact area."

Typically, the sensing plate defines an imaging surface of an electronic device such as, but not limited to: a touch-sensitive surface; a touch-sensitive display; a force-sensitive surface; a force-sensitive display; a cover glass of a display; an exterior surface of a housing or enclosure such as a protective outer layer; a sidewall surface of an electronic device; and so on. In these embodiments, the contact area typically takes the shape of a pad of a user's fingertip (e.g., an ellipse).

In many embodiments, each pixel of a resolved image corresponds to an attenuation experienced by a reflection of an acoustic pulse propagating to, and reflecting from, that respective pixel location. The amount of attenuation (e.g., an "attenuation coefficient") at a particular location corresponds to a value (e.g., darkness, lightness, color, brightness, saturation, hue, and so on) of the associated pixel of the resolved image.

For example, the attenuation coefficient may be a number from 0 to 1.0, and the corresponding pixel may include a brightness value from 0 to 255 units. In this example, the attenuation coefficient and the brightness of the corresponding pixel value may be linearly related, although such a relationship is not necessarily required of all embodiments.

The resolution of the resolved image (and thus the number and/or distribution of pixels forming the same) can be based, at least in part, on the expected or average size of various features of the user's fingerprint. In one example, the resolution of the resolved image is greater than 120 pixels per centimeter (approximately 300 pixels per inch). In further examples, the resolution of the resolved image is greater than or equal to 200 pixels per centimeter (approximately 500 pixels per inch). In still further examples, other resolutions may be suitable. In some cases, the resolution of the resolved image may be non-uniform; certain areas of the resolved image may have a higher resolution than other areas.

As may be appreciated, and as noted above, an attenuation coefficient associated with a particular location of the sensing plate (e.g., a "local attenuation coefficient") changes when a fingertip (or more particularly, a "feature" of a fingertip such as a ridge or a valley) is in physical contact with, or otherwise "wets" to, the sensing plate at that specific location. This is due to an acoustic impedance mismatch introduced by the wetting of the fingertip (or feature) to the sensing plate at that location.

As noted above, the term "wetting" and related terminology refers to the spreading and/or partial compression of an object (often a solid object such as a finger), or the outermost surface of the same, when the object physically contacts or touches a surface. For example, a fingertip wets to the surface of the sensing plate when the user presses the fingertip against the sensing plate, causing the ridges of the fingerprint to compress and spread by a certain amount, thereby displacing substantially all air between the ridges of the fingerprint and the surface of the sensing plate, For example, as noted above, a feature of a fingertip in direct physical contact with the sensing plate at a particular location (e.g., a ridge of a fingerprint) attenuates an acoustic pulse propagated toward it, thereby affecting the value of the associated pixel of the resulting image. Conversely, a feature that does not wet to the surface of the sensing plate (e.g., a valley of a fingerprint) may not substantially attenuate acoustic pulses propagated therethrough, similarly not affecting the value of the associated pixel of the resulting image.

In this manner, the value of each pixel of the resolved image corresponds to whether or not a feature of a fingertip is wetted to the sensing plate at that pixel location. More specifically, the pixels of the resolved image correspond to whether a ridge or a valley of a user's fingerprint is present at that pixel location. In this manner, the resolved image may serve as a direct proxy for an image of the user's fingerprint.

Furthermore, different features of a fingertip may introduce different acoustic impedance mismatches, thus resulting in different local attenuation coefficients and different pixel values in the resolved image. For example, denser features of the fingertip (e.g., scar tissue) wetted to the sensing plate may change local attenuation coefficient(s) differently than less dense features wetted to the surface of the sensing plate. In other cases, the force with which the user touches the sensing plate may affect local attenuation coefficients by compressing the fingertip against the sensing plate. In this manner, the resolved image may exhibit contrast corresponding to the relative density of features of the fingertip wetted to the sensing plate.

Accordingly, generally and broadly, an acoustic imaging system such as described herein is configured to resolve an image of a user's fingerprint by resolving an image of the acoustic attenuation effects provided by various features of the fingertip that make physical contact with the sensing plate at various location. Such an image may be referred to herein as an "acoustic attenuation map" of a sensing plate or contact area.

In some embodiments, an acoustic attenuation map can be modeled as a matrix, a vector, or as a function, the inputs of which are coordinates that correspond to locations on the sensing plate. It may be appreciated that an acoustic imaging system such as described herein can obtain, resolve, or estimate an acoustic attenuation map of a sensing plate (or contact area of the sensing plate) using any suitable or implementation-specific method or combination of methods, several of which are described in detail below.

FIG. 1A depicts an electronic device 100a incorporating a thin-film acoustic imaging system defining an imaging surface above an active display area of the electronic device, such as described herein.

As depicted, an electronic device 100a can be implemented as a portable electronic device such as a cellular phone, although such an implementation is not required and other embodiments may be implemented as, without limitation: input devices; laptop computers; desktop computers; industrial processing interfaces; home automation devices; industrial security devices; navigation devices; peripheral input devices; and so on.

As may be appreciated, for simplicity of illustration, the electronic device 100a is depicted without many elements and functional components that may be leveraged by the electronic device to perform various operations, including operations related to an acoustic imaging system, such as described herein. For example, although not depicted, it may be appreciated that the electronic device 100a can include one or more processors, one or more memory elements, one or more data stores, one or more input components or sensors, and so on. As described herein, the term "processor" refers to any software and/or hardware-implemented data processing device or circuit physically and/or structurally configured to instantiate one or more classes or objects that are purpose-configured to perform specific transformations of data including operations represented as code and/or instructions included in a program that can be stored within, and accessed from, a memory. This term is meant to encompass a single processor or processing unit, multiple processors, multiple processing units, analog or digital circuits, or other suitably configured computing element or combination of elements.

The electronic device 100a includes a housing 102 and a display 104 defining an active display area 106. The display 104 is disposed below a protective outer layer to protect the display 104 from damage. In this manner, the protective outer layer above the display forms a portion of the housing 102, defining an exterior surface thereof. In many cases, the protective outer layer can be formed from an optically transparent and mechanically rigid material such as glass, sapphire, polycarbonate, and so on. In many embodiments, the protective outer layer protecting the display 104 can be manufactured, at least in part, from a material exhibiting a high acoustic impedance, such as glass, crystalline materials, or transparent ceramic. In this context, "high" acoustic impedance refers to materials having an acoustic impedance greater than air and/or greater than organic material, such as a user's finger.

In many embodiments, an acoustic imaging system 108 can be disposed within the housing 102 of the electronic device 100a. As with other embodiments described herein, the acoustic imaging system 108 can include an array of acoustic transducers that are configured to generate acoustic pulses and to receive reflections (e.g., echoes) thereof.

For example, in some embodiments, the acoustic imaging system 108 can be coupled to (e.g., adhered) an internal surface the protective outer layer of the display 104. As a result of this construction, the acoustic imaging system 108 can be leveraged to resolve an image of an object, such as the pad of a fingertip (e.g., fingerprint) of a user 110, in physical contact with the protective outer layer. More particularly, the acoustic imaging system 108 can be configured to determine an acoustic attenuation map of an imaging surface defined as a portion of an exterior surface of the protective outer layer of the display 104.

In some cases, the acoustic imaging system 108 is configured to generate and/or estimate an acoustic attenuation map of only a portion of the protective outer layer of the display 104. This may increase the speed with which the acoustic attenuation map may be generated and/or estimated by reducing the number of calculations and/or operations required. In the illustrated embodiment, the portion of the protective outer layer is identified with a dotted line enclosing a rectangular area. In other examples, other area shapes are possible.

Once an image of fingerprint (or other biometrically-unique surface characteristics such as handprints, ear prints, and so on) of the user 110 is imaged by the acoustic imaging system 108, the obtained image can be compared to a database of known images to determine if the obtained image, and/or features or information derived therefrom (e.g., vector maps, hash values, and so on), matches a known image.

If an affirmative match (e.g., a match exceeding or otherwise satisfying a threshold) is obtained, the electronic device 100a can perform a function related to the match. In one example, the electronic device 100a performs a privacy-sensitive authenticated function, such as displaying financial information on the display 104.

In other embodiments, an acoustic imaging system, such as the acoustic imaging system 108 may be disposed relative to other portions of the housing 102 of the electronic device 100a, so as to defined imaging surfaces elsewhere than shown in FIG. 1A. For example, FIG. 1B depicts an example configuration in which an acoustic imaging system 108 can be positioned relative to a sidewall of the electronic device 100b, such that a fingerprint image of a user 110 can be captured while the user 110 grasps the phone. In another example depicted in FIG. 1C, an acoustic imaging system 108, such as described herein, can be disposed along a sidewall of a housing 102 of the electronic device 100c. In contrast to FIG. 1B, in FIG. 1C, the acoustic imaging system 108 can extend for substantially an entirely length of a sidewall of the housing 102 of the electronic device 100c. As a result of this construction, multiple fingerprint images can be captured simultaneously, such as the user's fingerprint 110a and the user's fingerprint 110b.

These foregoing embodiments depicted in FIGS. 1A-1C and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, it may be appreciated that any number of acoustic imaging systems can be included in an electronic device, such as described herein. Such systems can be associated with any internal or external surface of an electronic device; some constructions may position an acoustic imaging system adjacent to a sidewall surface of an electronic device, whereas others may position an acoustic imaging system below or relative to an active display area of a display. It is appreciated that any suitable number of configurations and constructions are possible in view of the description provided herein.

For example, FIGS. 1D-1H depict an example set of embodiments in which an acoustic imaging system, such as described herein, can be incorporated into various portions of a wearable electronic device such as a smart watch secured to a wrist of a user by a band. As noted above, this is merely one example of an electronic device or, more generally, one example of a wearable electronic device, and it may be appreciated that other constructions and architectures are possible in view of the embodiments described herein.

Figure 2A:
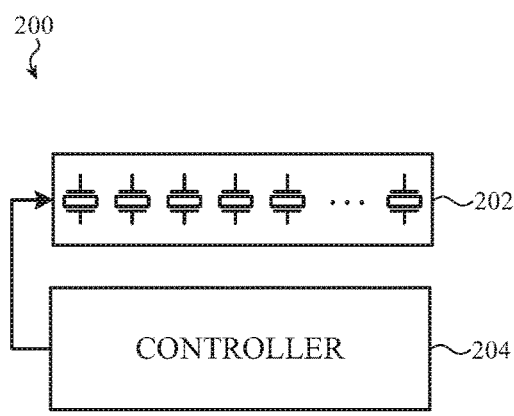
FIG. 2A depicts an example simplified system diagram of a thin-film acoustic imaging system including a rectilinear distribution of piezoelectric transducers, such as described herein.
Figure 2B:
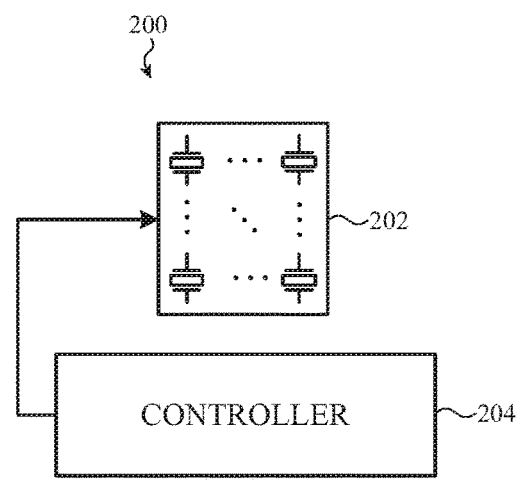
FIG. 2B depicts an example simplified system diagram of a thin-film acoustic imaging system including a grid distribution of piezoelectric transducers, such as described herein.
Figure 2C:
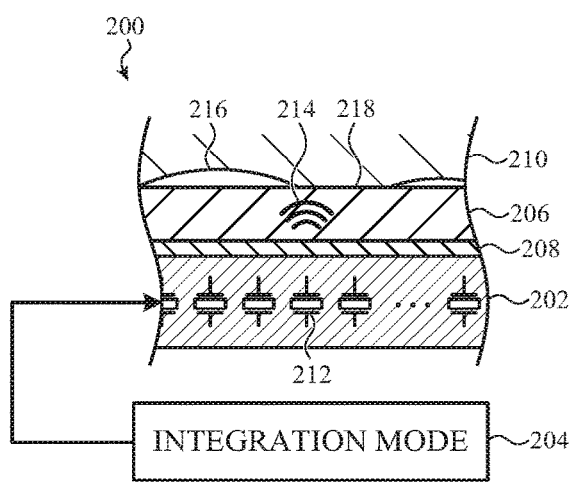
FIG. 2C depicts an example simplified system diagram of the thin-film acoustic imaging system of FIG. 1A, taken through section A-A, depicting an acoustic wave propagating toward a user's finger wetting to an imaging surface.
Figure 2D:
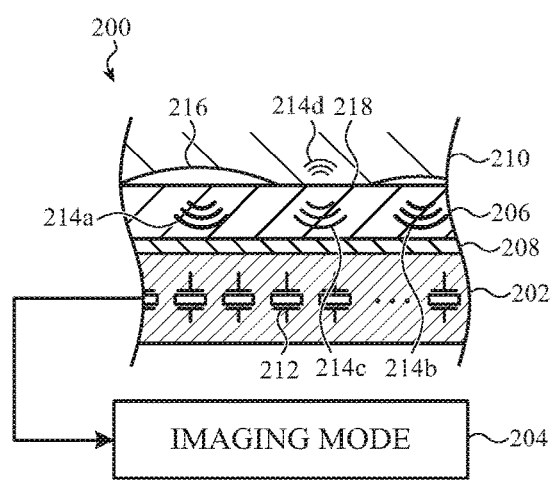
FIG. 2D depicts the simplified system diagram of FIG. 2C, depicting a set of acoustic wave reflections propagating from impedance mismatch boundaries defined by contours of the user's fingerprint.

For example, FIG. 2D depicts a wearable electronic device 100d that includes a housing 112 enclosing and supporting operational and functional components of the wearable electronic device 100d. The housing 112 can be formed from any suitable material including plastics, metals, ceramics, glass, and so on. The housing 112 can be rigid or flexible and may be monolithic or formed from multiple discrete sections, layers, or portions of material—which may be the same material or differing materials—and may take any suitable shape. The housing 112 can have rounded or flat sidewalls.

The housing 112 can be secured to a limb of a wearer, such as a wrist, by a band 114. The band 114 can be flexible or rigid and can be formed from any suitable material or combination of materials. The band 114 can be formed from, and/or defined by, a single piece of material or multiple interlocking or interwoven pieces of material. The band 114 can be configured to stretch, flex, and/or bend around or contour to a user's wrist in any suitable manner.

The housing 112 can enclose a display that can be used to render a graphical user interface within an active display area 116 configured to emit light through at least a portion of the housing 112. In some examples, a display defining the active display area 116 can be positioned below a cover glass that defines at least a portion of an exterior surface of the housing 112.

Figure 1D:
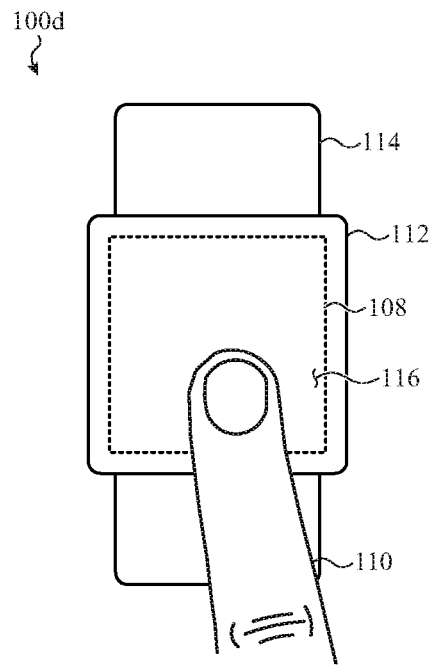
FIGS. 1D-1H depict an example wearable electronic device incorporating a thin-film acoustic imaging system, such as described herein.

As with other embodiments described herein, the wearable electronic device 100d can incorporate acoustic imaging system that may be configured in the same manner as described above with respect to FIGS. 1A-1C. In FIG. 1D, the acoustic imaging system is identified as the acoustic imaging system 108. In this illustration, the acoustic imaging system 108 is disposed relative to the active display area 116 such that when a user 110 interacts with content rendered in the graphical user interface shown by the active display area 116 of the display of the wearable electronic device 100*d*, the acoustic imaging system 108 can operate to detect and/or image a fingerprint of the user 110.

Figure 1E:
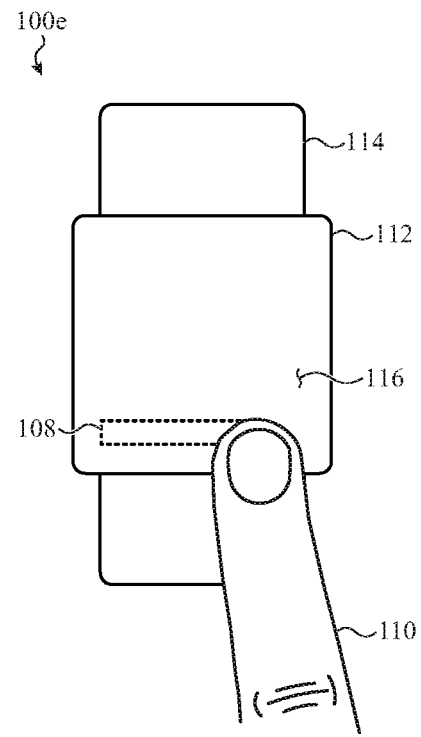
Figure 1F:
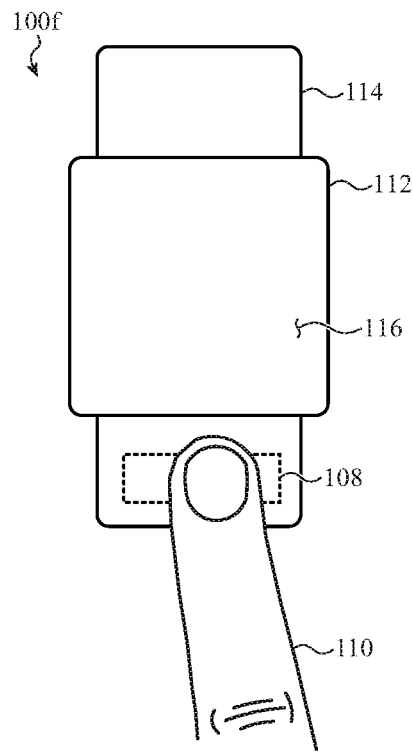

The depicted configuration is merely one example; the acoustic imaging system 108 can be disposed in any suitable portion of a wearable electronic device such as described herein. For example, FIG. 1E depicts a configuration in which a wearable electronic device 100*e* includes the acoustic imaging system 108 across only a portion of the active display area 116 of the wearable electronic device 100*e*. In other cases, an acoustic imaging system 108 can be included in at least a portion of the band 114, such as shown in FIG. 1F. In this embodiment, a user 110 that touches an exterior surface of the band 114 can engage the acoustic imaging system 108 which, in response, can generate an image of the user's fingerprint. In yet other examples, the acoustic imaging system 108 can be configured to image a surface of the wrist of the user 110.

In other words, in some configurations, the acoustic imaging system 108 can be oriented to direct acoustic imaging functionality toward the user's wrist. In some examples of these configurations, the acoustic imaging system 108 can be configured to detect and/or identify one or more skin characteristics of the epidermis of the wearer (e.g., the user 110). In other examples of these configurations, the acoustic imaging system 108 can be configured to image subdermal layers of the user's wrist, for either biometric imaging purposed or biometric data collection purposes. For example, in some examples, an acoustic imaging system 108 as described herein that is incorporated into a band 114 and/or a housing of a wearable electronic device such as the wearable electronic devices 100*d*, 100*e*, or 100*f* can be configured to generate an acoustic image of an interior of the user's wrist, such as an image of an artery, a vein pattern, a musculature image, a skeletal image, and so on. Such images, and/or combinations thereof, can be leveraged by the wearable electronic device for authentication purposes and/or biometric data collection purposes.

Figure 1G:
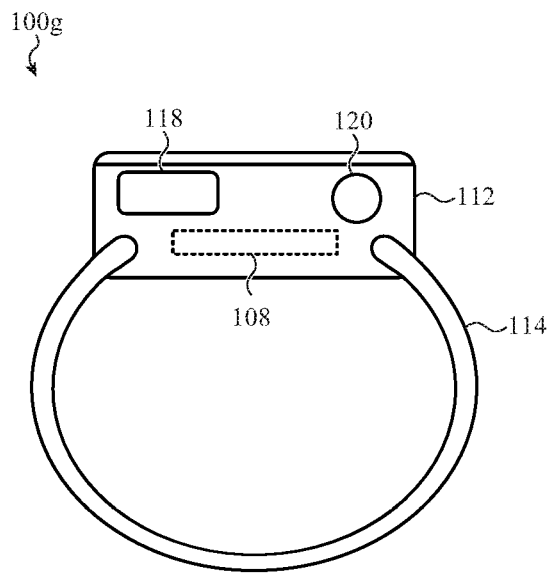

In yet further examples, the acoustic imaging system 108 can be incorporated into a sidewall surface of the housing 112. For example, FIG. 1G depicts the acoustic imaging system 108 positioned relative to a lateral sidewall of the housing 112, through which physical input controls may likewise extend. For example, as shown in FIG. 1G, a button 118 and/or a rotary input device 120 can be included. Each of these controls may be configured to move and/or rotate in response to an application of pressure or friction by a user, such as the user 110. A degree to which either control moves may be received by the wearable electronic device as an input. For example, the wearable electronic device 100*g* can receive a degree of rotation of the rotary input device 120 as a scrolling input and may receive a press of the button 118 as a selection input. These foregoing examples are not exhaustive; any suitable input device whether physical or virtual can be included in a wearable electronic device as described herein.

In the illustrated example, the acoustic imaging system 108 is configured to provide acoustic imaging functionality through a sidewall portion of the electronic device that is separate from other physical or virtual controls (e.g., buttons, rotary input devices, and so on) defined through that sidewall; this is merely one example configuration.

Figure 1H:
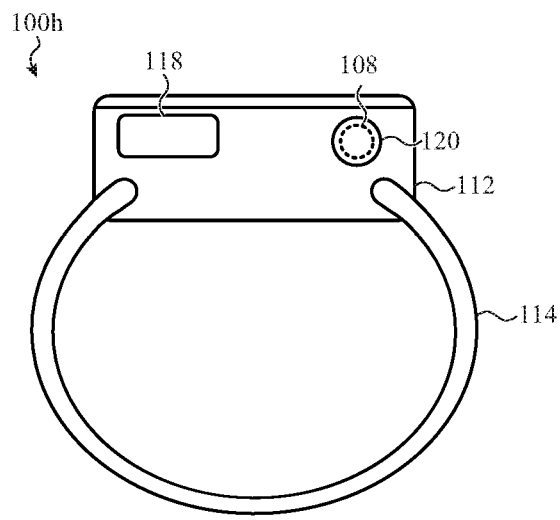

For example, in other embodiments, an acoustic imaging system such as the acoustic imaging system 108 can be included within a physical control of the wearable electronic device. For example, as shown in FIG. 1H, the acoustic imaging system 108 can be included within the rotary input device 120. In the illustrated embodiment, the acoustic imaging system 108 is disposed to provide acoustic imaging functionality from a circular surface area of the rotary input device 120, but this is also merely one example construction. In some examples, the acoustic imaging system 108 can be included within and/or disposed around a circumference of the rotary input device 120; in this construction, as a user rotates the rotary input device 120, a different portion of that user's finger is in contact with the rotary input device 120, thereby enabling the acoustic imaging system 108 to image a different portion of that user's fingerprint.

These foregoing embodiments depicted in FIGS. 1D-1H and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, generally and broadly, it may be appreciated that an acoustic imaging system can take any shape (e.g., rectilinear shapes, circular shapes, square shapes, polygonal shapes, and so on) and can be incorporated into any suitable electronic device or surface or input component thereof. Further, it may be appreciated that a single electronic device can include multiple different and/or discrete acoustic imaging systems. For example, in some embodiments, a first imaging system may be disposed within a button or rotary input device and a second acoustic imaging system may be disposed behind (and/or otherwise relative to) a display of the same wearable, portable, or stationary electronic device.

Figure 2E:
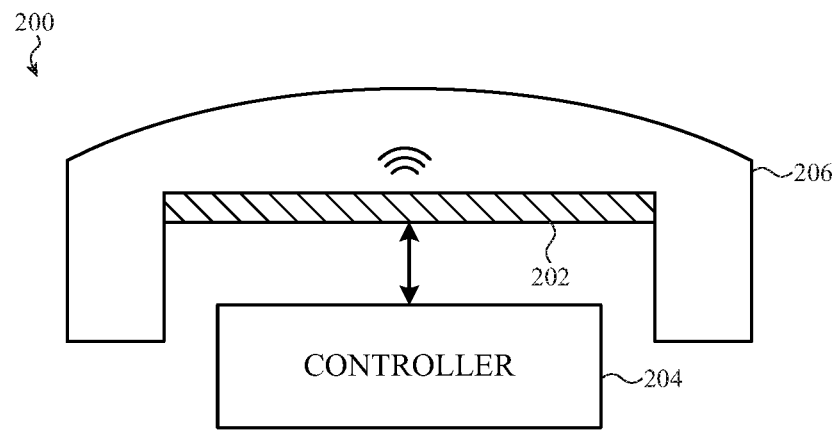
FIG. 2E depicts an example simplified system diagram of a thin-film acoustic imaging system positioned below, and configured to operate with, a convex imaging surface, such as described herein.
Figure 2F:
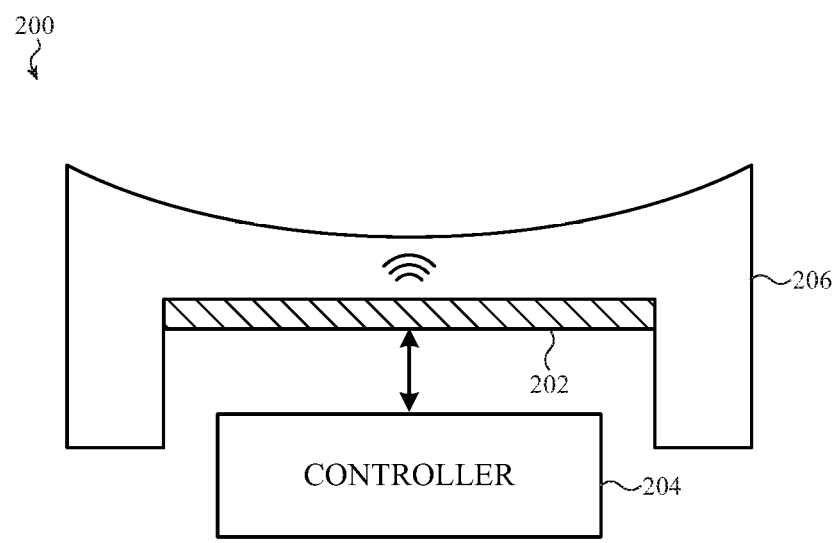
FIG. 2F depicts an example simplified system diagram of a thin-film acoustic imaging system positioned below, and configured to operate with, a concave imaging surface, such as described herein.
Figure 3:
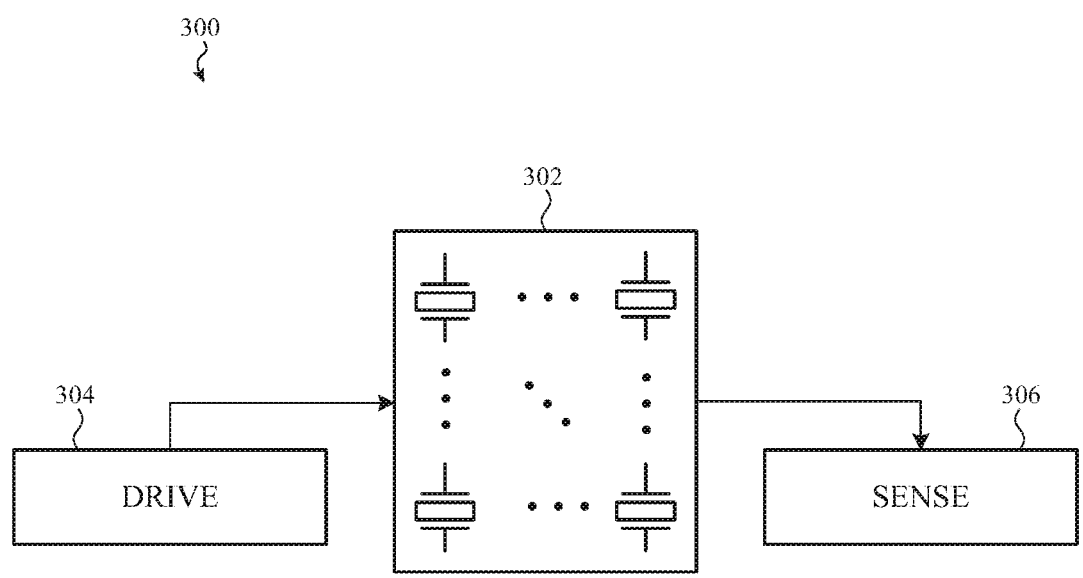
FIG. 3 depicts an example simplified system diagram of a thin-film acoustic imaging system, such as described herein.

Generally and broadly, FIGS. 2A-3 depict simplified system diagrams of an acoustic imaging system, such as described herein. Independent of whether the acoustic imaging system of these embodiments is constructed using d31 or d33 piezoelectric transducers, it may be appreciated that the piezoelectric transducers can be coupled to and/or otherwise formed on an application-specific integrated circuit, which in turn may be formed in a reel-to-reel or single-stage thin-film transistor manufacturing process. As a result of this configuration, an acoustic imaging system such as described herein can be manufactured without a requirement for alignment of an array of microelectromechanical piezoelectric transducers with signal traces, solder pads, or other electrical or mechanical coupling(s). As such, an acoustic imaging system, such as described herein, can be manufactured at a more rapid pace and/or can be coupled to a sensing plate (such as an electronic device housing as shown in FIGS. 1A-1C) to define an imaging surface in a number of suitable ways, several of which are described below.

Further, it may be appreciated that the following (and foregoing) embodiments may be coupled to a sensing plate with any suitable adhesive or mechanical fastener. In many embodiments, as may be appreciated by a person of skill in the art, an adhesive and/or mechanical fastener used to couple an acoustic imaging system, such as described herein, to a surface of a sensing plate (e.g., display, housing, sidewall, and so on) can be selected at least in part based on an acoustic impedance of that material (when cured, cooled, or otherwise in a final manufacturing state).

More specifically, in many embodiments adhesives to couple an acoustic imaging system to a sensing plate may be selected and/or deposited and/or cured so as to provide an acoustic impedance transition from an acoustic imaging system (and, in particular, an array of piezoelectric transducers of an acoustic imaging system) to the sensing plate. In this manner, a person of skill in the art will appreciate, that the acoustic imaging system can be more effectively matched to the sensing plate and, as a result, can more efficiently operate to obtain an image of an object wetting to an imaging surface, such as a fingerprint wetting to an external surface of an electronic device housing.

For example, and as noted above, embodiments described herein relate generally to methods and systems for operating acoustic imaging systems, such as those integrated into the electronic device(s) depicted in FIGS. 1A-1C. Many acoustic imaging systems described herein can be generalized to a simplified architecture including a sensing plate (e.g., a substrate; typically a monolithic substrate) with two parallel surfaces such as a top surface and a bottom surface. For convention herein, the bottom surface is understood to be coupled to (e.g., adhered to) at least a portion of the acoustic imaging system such that the acoustic imaging system is acoustically/mechanically coupled to the sensing plate via the bottom surface. Similarly, the top surface of a sensing plate described herein is understood to define an imaging surface; an object engaging the top/imaging surface may cause reflection(s) back to the bottom surface that, in turn, can be used to generate an image leveraging techniques described herein.

An array of acoustic transducers can be arranged in a pattern and positioned near the bottom surface. As described above, to capture an image of an object engaging the top surface, an acoustic imaging system can cause the array, or only a portion thereof, to propagate an acoustic pulse through the bottom surface of the sensing plate and toward the object. When the acoustic pulse reaches the top surface of the sensing plate, a portion of the acoustic pulse may be reflected back towards the array of acoustic transducers. As noted with respect to other embodiments described herein, the reflection(s) can be collected as an acoustic output from the sensing plate and an image of the top surface of the sensing plate can be approximated. In many embodiments, these operations of driving at least a portion of the array and receiving voltage signals from the array (corresponding to reflections from the top surface of the sensing plate, as referred to as the imaging surface), can be performed at least in part by an application-specific integrated circuit.

In many embodiments, an acoustic imaging system can implement the array of acoustic transducers as a number of individual ultrasonic elements formed from piezoelectric material such as lead zircanate titinate, zinc oxide, aluminum nitride, or any other piezoelectric material.

Piezoelectric materials may be selected for the speed with which the materials can react to an electrical stimulus or excitation and/or mechanical stimulus or excitation. In other words, piezoelectric materials can be selected for certain acoustic imaging systems requiring acoustic pulses of particularly high frequency (e.g., megahertz scale, such as 50 MHz).

In these examples, to capture an image of an object engaging the top surface (e.g., fingertip, stylus tip, and so on), the imaging system can cause one or more array of piezoelectric transducers to propagate an acoustic pulse (e.g., such as a plane wave or as a localized pulse having a specified center frequency) generally normal to the bottom surface and toward the object in order to monitor for any acoustic signals reflected therefrom. As noted above, this operation is referred to herein as "driving" the array of piezoelectric transducers. In other cases, driving a piezoelectric transducer/element may not necessarily generate an acoustic pulse normal to the bottom surface.

For example, as may be appreciated, an acoustic pulse may propagate from a single point source along a generally spherical three-dimensional trajectory. In some examples, such as noted above, acoustic energy propagating along a particular angle from a point source (e.g., a single acoustic transducer) may be timed so as to constructively interfere with an acoustic pulse output from a different acoustic transducer. Such embodiments leverage beamforming techniques and/or phased array control techniques to increase signal-to-noise ratios and/or image contrast. It is appreciated that these examples are not exhaustive; other driving/timing/control means may be possible in view of the description provided herein. For simplicity of description, many embodiments described herein reference a control schema in which an application-specific integrated circuit tasked with driving a piezoelectric transducer does so one transducer at a time. It is appreciated, however, that this is merely one example; in other cases, multiple transducers can be simultaneously driven and/or driven in a specifically-timed sequence (e.g., for beamforming purposes).

Notwithstanding the foregoing, and as described in reference to other embodiments described herein, when the acoustic pulse reaches the imaging surface of the sensing plate, a portion of the acoustic pulse may be reflected from the imaging surface and back towards the array of piezoelectric transducers as a result of the acoustic boundary (e.g., acoustic impedance mismatch) between the imaging surface and the portion of object engaging it. For example, a ridge of a fingerprint may present a different acoustic boundary when touching the sensing plate (e.g., soft tissue-sensing plate boundary) than a valley of a fingerprint (e.g., air-sensing plate boundary). Accordingly, a ridge of a fingerprint may reflect the acoustic pulse differently than a valley of a fingerprint. In other words, a ridge of a fingerprint produces a different acoustic output than a valley of a fingerprint.

When the acoustic pulse returns to the array of piezoelectric transducers, the elements can be used to capture the reflection as electrical signals or, more precisely, an application-specific integrated circuit conductively coupled to one or more of the piezoelectric transducers receiving the reflections may include an analog to digital converter configured to sample (at a Nyquist-appropriate frequency) voltage output from the one or more of the piezoelectric transducers. As noted above, this operation is referred to herein as "sensing" or "imaging" with the array of piezoelectric transducers. In other cases, voltage sampling may not be required; capacitive storage may be used (as one example) to determine voltage output at a given time.

For example, when an array of piezoelectric transducers receives a portion of the acoustic reflection affected by a ridge of a fingerprint, that array of piezoelectric transducers may produce an electrical signal that is different than the electrical signal produced by an array of piezoelectric transducers receiving a reflection affected by a valley of a fingerprint.

By analyzing the electrical signals, the imaging system can derive an image of the object engaging the imaging surface of the sensing plate. For example, each electrical signal can correspond to one pixel of the image. In one embodiment, a pixel corresponding to an electrical signal affected by a ridge of a fingerprint may be lighter than a pixel corresponding to an electrical signal affected by a valley of a fingerprint. As may be appreciated, this may be due to the fact that the acoustic impedance mismatch between air and the sensing plate is greater than the acoustic impedance mismatch between a fingerprint ridge and the sensing plate.

FIG. 2A depicts a simplified block diagram of an acoustic imaging systems that can be used with the electronic device 100 of FIG. 1. The acoustic imaging systems 200 can include one or more acoustic transducers 202. The acoustic transducers 202 can contract or expand rapidly in response to an electrical stimulus such as a voltage or current (e.g., electroacoustic transducer). For example, the acoustic transducers 202 can be formed, in certain embodiments, from a piezoelectric material such as lead zircanate titinate, zinc oxide, aluminum nitride, or any other piezoelectric material and may have a piezoelectric response characterized as d31, d32, or d33.

In many embodiments, the acoustic transducers 202 can be configured for both emitting and detecting acoustic signals. In other words, an acoustic transducer 212 can be used to both transmit an acoustic pulse in response to an electrical stimulus/excitation (such as from a voltage wavelet generated by an application-specific integrated circuit, such as described herein) and, in addition, can generate a voltage signal in response to an acoustic output (e.g., acoustic/mechanical energy received as a reflection) from the sensing plate.

In many examples, the acoustic transducers 202 can be arranged in a pattern. For example, in some embodiments the acoustic transducers 202 can be arranged in an evenly spaced line such as illustrated in FIG. 2A. In some embodiments, the acoustic transducers 202 can be arranged in a matrix or grid, as shown in FIG. 2B. In some examples, the matrix of the acoustic transducers 202 can be square or otherwise rectangular. In other examples, the matrix of the acoustic transducers 202 can take other shapes, such as a circular pattern (not shown).

Although many embodiments described herein distribute the acoustic transducers 202 in a uniform pattern (e.g., matrix, square, line, circle, and so on), such uniformity is not necessarily required, and in some examples, different regions may enjoy different concentrations/pitches of acoustic transducers.

The acoustic transducers 202 can be coupled to a controller 204, also referred to as an application-specific integrated circuit. The controller 204 can be configured to provide electrical energy (e.g., voltage signals) to each acoustic transducer 212 independently, or to groups of acoustic transducers collectively/simultaneously. For example, the controller 204 can provide a first voltage signal (e.g., chirp, wavelet, and so on) to a first transducer and a second voltage to a second transducer (e.g., phase-shifted chirp, wavelet, and so on). In addition, the controller 204 can control the duration and magnitude of the electrical energy applied to each independent acoustic transducer 212. Further, the controller 204 can be configured to control a center frequency of any voltage signal applied to the transducers; for example, the controller 204 can be configured to control a center frequency of a wavelet to be greater than 40 MHz, such as 50 MHz.

In many examples, the controller 204 can operate in one or more modes, either simultaneously, according to a duty cycle, or in another suitable manner. In certain embodiments, the controller 204 can have an integration mode.

In other embodiments or implementations, the integration mode can be referred to as an integration mode or a drive mode. Accordingly, as used herein, terms and phrases such as "integration mode" and "drive mode", may be understood to each refer to the same operational mode of an acoustic imaging system.

When in the integration mode, the controller 204 can be configured to provide electrical energy in the form of a voltage signal having high frequency content (e.g., a center frequency above 40 MHz, such as 50 MHz) to one or more of the acoustic transducers 202 and in response, the acoustic transducers 202 can produce an acoustic output, referred to herein as an acoustic pulse. As may be appreciated the acoustic pulse produced by one or more transducers typically exhibits the same frequency content as the voltage signal used to excite the transducers.

In many embodiments, and as noted above, the acoustic imaging system 200 can be disposed within a housing of an electronic device.

In some examples, the acoustic imaging system 200 can be segmented into an array of sub-portions. Each subportion may include a dedicated controller 204, or at least a dedicated portion of the controller 204. For example, in some embodiments, the acoustic transducers 202 can be arranged in a high aspect ratio (e.g., greater than 1) array of 128×42. In this configuration, the array can be subdivided into a grid of 4×2, in which each subportion of the grid includes 32×21 individual acoustic transducers. Each of these individual subgroups of acoustic transducers can be controlled and/or operated independent of each of the other individual subgroups of acoustic transducers. In some examples, each individual subgroup (or "tile") is associated with a respective dedicated controller 204 which can perform both drive and/or sense operation for that individual tile.

In other cases, only a portion of the operations of a controller (e.g., drive operations, sense operations, filtering operations, beamforming operations and so on) can be dedicated to a particular tile. For example, in some cases, each tile may have a shared analog front end for sensing, may share a drive controller for drive operations, and so on.

In view of the foregoing, it may be appreciated that an array of acoustic transducers as described herein can be subdivided into any set of tiles, which may be rectilinear, square, or may follow any pattern (e.g., tessellating patterns, concentric patterns, linear patterns, rows and columns, and so on). Each subdivision of an array of acoustic transducers as described herein can be controlled independently with independent control electronics, and/or may be controlled in cooperation with one or more other subdivisions or tiles.

For example, FIG. 2C depicts the acoustic imaging system of FIG. 2A positioned below a sensing plate 206. As noted with respect to FIG. 1, the sensing plate 206 can be a portion of a display, a portion of an input device (e.g., button, switch, and so on), or a portion of the housing of the electronic device. The sensing plate 206 can include active components (e.g., circuits, circuit traces, batteries, and so on) or passive components (e.g., glass sheet, metal sheet, and so on) or a combination thereof.

The sensing plate 206 defines a bottom surface and an imaging surface. The bottom surface is coupled to the acoustic transducers 202 via an adhesive layer 208. The imaging surface of the sensing plate 206 is opposite the bottom surface and is configured/oriented to receive an object, such as a finger of a user 210. As with other embodiments described herein, the finger of the user 210 may include one or more features that introduce different acoustic impedance mismatches when wetting to the imaging surface of the sensing plate 206.

The acoustic transducers 202 can be positioned below the sensing plate 206 so as to be in acoustic communication with the bottom surface, acoustically coupled to the bottom surface via the adhesive layer 208. In this manner, when an acoustic transducer 212 generates an acoustic wave 214 in response to an excitation from the controller 204 (in the interrogation mode), the acoustic wave 214 can propagate into the sensing plate 206, through the bottom surface, toward the imaging surface and, in turn, toward any feature(s) of the fingerprint of the user 210, such as a valley 216 or a ridge 218.

While the acoustic wave 214 propagates through the sensing plate 206 toward the imaging surface, the controller 204 can transition partly or entirely into an imaging mode, such as depicted in FIG. 2D. When in the imaging mode, the controller 204 can be configured to receive, sample, and/or analyze an electrical signal from one or more of the acoustic transducers 202 that corresponds to an acoustic output of the sensing plate 206 resulting from a portion of a reflection (such as reflections 214a, 214b, or 214c) of the acoustic wave 214 (see, e.g., FIG. 2C), such as may originate as a result of wetting of the ridge 218 to the imaging surface and/or as a result of an air gap captured by the valley 216. It may be appreciated that a certain portion of energy of the acoustic wave 214 may be absorbed by the user's finger; this absorbed energy is depicted as the acoustic wave 214d.

Phrased in another non-limiting manner, in many embodiments, an acoustic reflection from a particular location along the imaging surface may depend upon whether that location is below the ridge 218 or the valley 216. More particularly, the acoustic boundary between the sensing plate 206 and the ridge 218 (having an acoustic impedance of soft tissue) may cause a measurably smaller amplitude acoustic reflection than the acoustic boundary between the sensing plate 206 and the valley 216 (having an acoustic impedance of air).

As noted above, the amplitude of a reflection from a ridge/sensing plate acoustic boundary may be a smaller than the amplitude of a reflection from a valley/sensing plate acoustic boundary. In other words, the amplitude of an acoustic reflection 216c from an area of the imaging surface that is below a ridge 218 may be less than the amplitude of an acoustic reflection 214a, 214b from an area of the imaging surface that is below a valley 216. Accordingly, the controller 204, when in an imaging mode, can monitor the amplitude (and/or timing, phase, or any other suitable property) of an acoustic reflection to derive, determine, assemble, or create, an image of the ridges and valleys of a user's fingerprint or, more generally, any suitable contour of any suitable object wetting to the imaging surface.

Accordingly, more generally and broadly, it may be appreciated that an acoustic imaging system such as described herein includes two primary components: an array of acoustic transducers and an application-specific integrated circuit configured to operate in a drive mode and a sense mode. In some examples, the drive mode and the sense mode can be time multiplexed, whereas in other examples, a drive mode may be configured to operate in one region while a sense mode is configured to operate in another region. A person of skill in the art may readily appreciate that any suitable control schema can be used. For example, in some cases as described herein beamforming techniques can be used to concentrate acoustic energy output from two or more acoustic transducers of an array of acoustic transducers at a particular location. In some examples, beamforming may also be used in a receive mode to spatially filter a received signal or set of received signals.

Further, it may be appreciated that a planar imaging surface is not a requirement of the embodiments described herein. A person of skill in the art may readily appreciated that the systems methods and architectures described herein can be readily applied to image wetting of an object to a non-planar surface. For example, FIG. 2E depicts an acoustic imaging systems 200 can include one or more acoustic transducers 202 communicably coupled to a controller 204 that can be configured to operate in a drive mode and/or a sense mode, such as described above.

The controller, as with other embodiments described herein can operate the one or more acoustic transducers 202 as a monolithic entity (e.g., driving all or substantially all transducers at the same time to generate a plane wave) or may subdivide control of the array of transducers such that only some of the one or more acoustic transducers 202 are actively imaging (e.g., being driven and/or used for sensing) at any given time. In such examples, it may be appreciated that the controller can execute any suitable sweep pattern, beamforming technique, or spatial or temporal filtering technique. In this example, however, the sensing plate 206 may take a nonplanar shape, such as a convex shape.

An example implementation in which the sensing plate 206 has a convex shape may be an implementation in which the acoustic imaging system 200 is incorporated into a sidewall of a housing of an electronic device, such as shown in FIG. 1B and 1C. In other cases, the acoustic imaging system 200 can be incorporated into an electronic device that has a curved portion of a housing, such as a smartwatch with a curved exterior surface (which may be a sidewall surface, a crown surface, a button surface, or any suitable exterior surface).

Further to the foregoing, it may be appreciated that convex and planar sensing plat shapes are not limiting; more generally, any sensing plate geometry and/or sensing plate side cross-section can be used. For example, FIG. 2F depicts a convex sensing plate 206 that may be used in certain implementations.

It may be appreciated by a person of skill in the art that an acoustic imaging system as described herein can be incorporated into any suitable electronic device, whether portable or stationary, and may be positioned relative to any suitable sensing plate or sensing surface or imaging surface. In some examples, the sensing plate may be planar and formed from glass. In other cases, the sensing plate may be nonplanar and may be formed from metal, such as titanium. In yet other examples, the sensing plate may be curved and/or patterned and the sensing plate may be a ceramic material. It may be further appreciated that control of an acoustic imaging system may vary by implementation in part due to differences in acoustic propagation speed through different materials. In other words, it may be appreciated that an acoustic imaging system as described herein can be incorporated in to many electronic devices, formed from many different materials, and may necessarily operate and/or be configured to operate in different manners based on the selected implementation.

FIG. 3 depicts a simplified block diagram of an acoustic imaging system 300 having both drive and sense modes of operation. An acoustic transducer array 302 can include two or more acoustic transducers. For example, in some embodiments the acoustic transducer array 302 can include an N×M array of individual transducers.

Conductively coupled to the acoustic transducer array 302 can be a drive controller 304, which may be a portion of an application-specific integrated circuit, such as described herein. The driver controller 304 can be configured to deliver a voltage signal, such as a wavelet with a specified center frequency, to one or more transducers of the acoustic transducer array 302.

In some cases, the drive controller 304 can be implemented as a plurality of drive controllers 304. For example, in such an embodiment, each individual transducer of the array of acoustic transducers 302 can be coupled to a respective one drive controller 304. In another example, a single drive controller 304 can be coupled to a subset or subarray of acoustic transducers of the array of acoustic transducers 302. In these and related embodiments, adjacent transducers (and/or all transducers of the acoustic transducer array 302) can share one or more electrodes or traces associated with the drive controller 304.

Conductively coupled to the acoustic transducer array 302 can be a sense controller 306, which may be a portion of an application-specific integrated circuit, such as described herein. The sense controller 306 can be configured to receive a voltage signal from one or more transducers of the acoustic transducer array 302. As with the drive controller 304, in some cases, the sense controller 306 can be implemented as a plurality of sense controllers 306.

For example, in such an embodiment, each individual transducer of the array of acoustic transducers 302 can be coupled to a respective one sense controller 306. In another example, a single sense controller 306 can be coupled to a subset or subarray of acoustic transducers of the array of acoustic transducers 302. In these and related embodiments, adjacent transducers (and/or all transducers of the acoustic transducer array 302) can share one or more electrodes or traces associated with the sense controller 306.

These foregoing embodiments depicted in FIGS. 2A-3 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, acoustic transducers such as described herein can be constructed in a number of ways. In typical embodiments, an acoustic transducer or, more precisely, an array of acoustic transducers, is manufactured using thin-film deposition techniques such that the array is formed over and/or formed with an application-specific integrated circuit that performs drive and sense operations, such as described herein. However, this is merely one example construction; other embodiments in which a stack of layers defining an acoustic transducer is disposed over an application-specific integrated circuit are also possible in view of the description provided herein.

For example, generally and broadly, FIGS. 4A-6 depict simplified system diagrams of an acoustic imaging system, such as described herein, that can be formed entirely using a thin-film manufacturing process in which an application specific integrated circuit is formed in substantially the same process as an array of d33 piezoelectric transducers suitable to generate an acoustic pulse or a phased-array of acoustic pulses, such as described herein. As with other described embodiments, it may be appreciated that, independent of whether the acoustic imaging system of these embodiments is constructed using d31 or d33 piezoelectric transducers, such transducers can be coupled to and/or otherwise formed on an application-specific integrated circuit, which in turn may be formed in a reel-to-reel or single-stage thin-film transistor manufacturing process.

As a result of these described and related configurations, an acoustic imaging system such as described herein can be manufactured without a requirement for alignment of an array of microelectromechanical piezoelectric transducers with signal traces, solder pads, or other electrical or mechanical coupling(s), as noted above. As such, an acoustic imaging system, such as described herein, can be manufactured at a more rapid pace and/or can be coupled to a sensing plate (such as an electronic device housing as shown in FIGS. 1A-1C) to define an imaging surface in a number of suitable ways, several of which are described below.

Figure 4A:
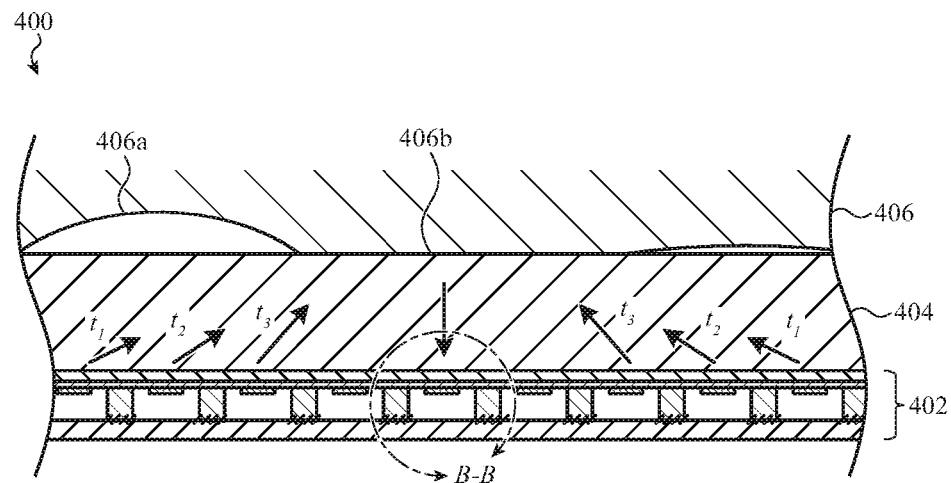
FIG. 4A depicts an example simplified system diagram of acoustic imaging system such as described herein, depicting acoustic waves constructively interfering and propagating toward a feature of a user's finger wetting to an imaging surface.
Figure 4B:
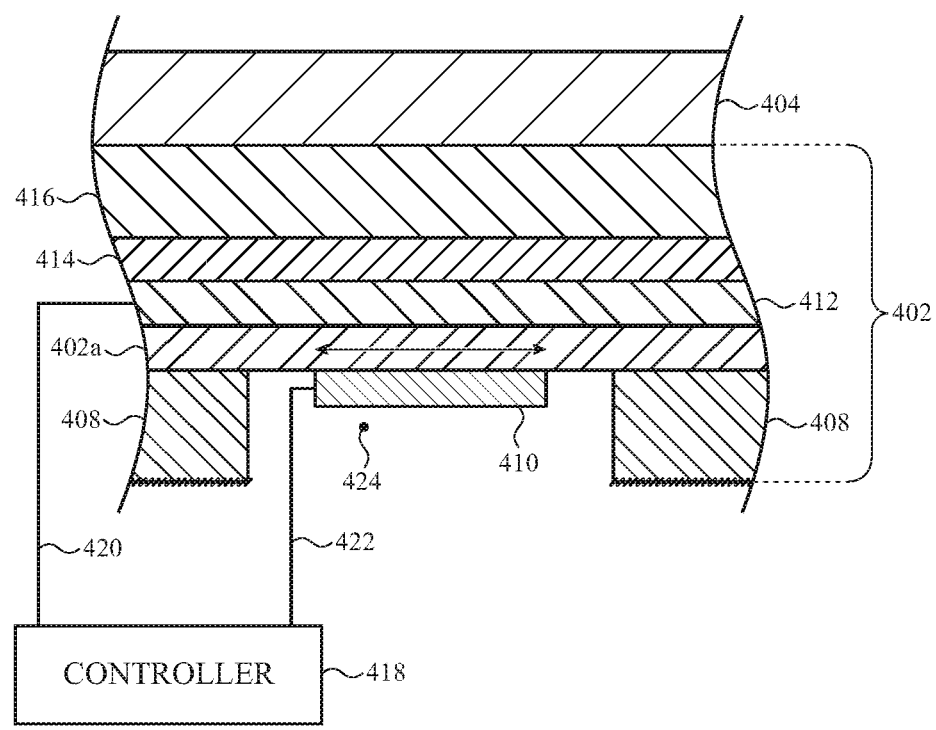
FIG. 4B depicts an example simplified detail view of a portion of the acoustic imaging system of FIG. 4A, within circle B-B, including a d31 piezoelectric actuator with a vacuum cavity backing.

FIGS. 4A-4B depict an example stack-up of layers defining a set of acoustic transducers that may be formed over an application-specific integrated circuit, such as described herein. The application-specific circuit, although not shown, may be configured in a similar manner as described with respect to other embodiments described herein.

FIG. 4A depicts a simplified system diagram of acoustic imaging system such as described herein, depicting acoustic waves constructively interfering and propagating toward a feature of a user's finger wetting to an imaging surface. In particular, the acoustic imaging system 400 includes an array of acoustic transducers 402 adhered to a bottom surface of a sensing plate 404 that defines an imaging surface that may be touched by a user's finger 406, which as noted with respect to other embodiments described herein can include unique features, some of which may wet to the imaging surface and some of which may not. In particular, a valley of the user's finger 406, identified as the valley 406a, may not wet to the imaging surface, whereas a ridge of the user's finger 406, identified as the ridge 406b, may wet to the imaging surface. Also depicted in this embodiment are various paths that may be taken by acoustic pulses generated by different acoustic transducers. In particular, if the acoustic transducers of the array of acoustic transducers 402 are driven in a phase-shifted manner, multiple acoustic pulses can constructively interfere at a single point of the imaging surface, thereby increasing a magnitude of a reflection from that surface that may return to the array of acoustic transducers 402. As noted above, such an operation may be referred to as a beamforming operation.

In the illustrated embodiment, different transducers of the array of acoustic transducers 402 are separated at a constant pitch defining, at least in part, a minimum resolution of the acoustic imaging system. In some examples, the pitch separating the transducers of the array of acoustic transducers 402 may be less than 100 μm, such as 70 μm. In other cases, different pitches may be considered or may be suitable for different implementations or desired resolutions.

FIG. 4B depicts a simplified detail view of a portion of the acoustic imaging system of FIG. 4A, within circle B-B, including a d31 piezoelectric actuator (as one example) with a vacuum cavity backing. In particular, a single transducer of the array of acoustic transducers 402 is shown. The depicted transducer is elevated above a base substrate (not shown), which may serve as a portion of an application-specific integrated circuit such as described herein, by a spacer 408 which may be made from a metalloid oxide, such as silicon dioxide. In some examples, the embodiment depicted can be referred to as a piezoelectric micro-machined ultrasonic transducer (pMUT).

The spacer 408 serves as a support for a piezoelectric element layer 402a that defines the acoustic transducer. The piezoelectric element layer 402a is a d31 piezoelectric element, and is configured to expand or contract in a lateral direction, as indicated by double-ended arrows centered therein. The piezoelectric element layer 402a is coupled to two electrodes, a first electrode 410 and a second electrode 412. Each of the electrodes may be understood to be portions of a first and second electrode layers, respectively. (see, e.g., FIG. 4A). More specifically, it may be understood that discrete electrodes can be defined in a single layer via suitable deposition/etching/manufacturing techniques. Electrodes may be conductively coupled in rows or columns, or may be individually addressable.

It may be appreciated that these foregoing examples are not exhaustive; a person of skill in the art may appreciate that the depicted first and second electrodes (e.g., the first electrode 410 and the second electrode 412) may be portions of a respective first and second electrode layer extending beyond the detail view shown in FIG. 4B. In such embodiments each electrode of an electrode layer may be conductively coupled to a controller or application-specific integrated circuit via one or more sets of electrical traces (not shown in FIG. 4B). Such sets of electrical traces can be formed or disposed over any suitable layer of such as described herein.

The electrodes are typically disposed onto or formed onto the piezoelectric element layer 402a and are made from an electrically conductive material, such as metal. In many examples, the electrodes may be made from the same metal material, but this is not required of all embodiments. For example, in some embodiments the first electrode 410 may be made from aluminum whereas the second electrode 412 is made, at least in part, from molybdenum.

The second electrode 412 may be coupled to a stiffener layer 414, which, in turn, may be disposed below an adhesive/epoxy layer 416 that acoustically and mechanically couples the transducer to the sensing plate 404. In many embodiments, the stiffener layer 414 is made from a metal or metalloid material, such as silicon.

As a result of this construction, a controller 418 (which may be a portion of an application-specific integrated circuit, such as described herein) can be conductively coupled to the first electrode 410 and the second electrode 412 via one or more routing traces (such as the traces 420, 422, defining a set of electrical traces) so that the controller 418 can both drive the piezoelectric element layer 402a and sense electrical signals from the piezoelectric element layer 402a. More specifically, as a result of the depicted construction, a voltage signal (such as a chirp signal or a wavelet) output from the controller 418 can cause a voltage potential difference between the first electrode 410 and the second electrode 412 (polarity and/or frequency content of the voltage may vary from embodiment to embodiment) thereby causing the piezoelectric element layer 402a to laterally expand or contract.

Due, at least in part, to the asymmetrical boundary conditions defined by the spacer 408, a vacuum cavity/backing volume 424 enclosed by the spacer 408, and the stiffener layer 414, the lateral expansion of the piezoelectric element layer 402a results in a mechanical deformation of the piezoelectric element layer 402a along a direction perpendicular to the lateral expansion, thereby generating an acoustic pulse through the stiffener layer 414 and the adhesive/epoxy layer 416 that can, thereafter, propagate into the sensing plate 404.

In one specific implementation, the spacer 408 has a thickness of approximately 2 μm, the first electrode 410 has a thickness of approximately 0.1 μm, the piezoelectric element layer 402a has a thickness of approximately 1.0 μm, the second electrode 412 has a thickness of approximately 0.1 μm, the stiffener layer 414 has a thickness of approximately 1.7 μm, and the adhesive/epoxy layer 416 has a thickness of approximately 15 μm. These example thickness are merely illustrative of the relative thickness of the various layers that may be appropriate in certain configurations. In many examples, different thicknesses, including relative thicknesses may be suitable, especially upon consideration of a center frequency output by and received by the controller 418.

However, as noted with respect to certain embodiments described herein, an architecture such as depicted in FIGS. 4A-4B may exhibit a lower acoustic impedance than the sensing plate 404 which in turn can reduce operational efficiency of the acoustic imaging system. As such, alternative higher-impedance stack-ups are described below that may be more suitable to acoustically couple to sensing plates having high acoustic impedance, such as sensing plates made from metal (e.g., stainless steel), glass, or ceramics. Such materials, as noted above, as may be used to define certain portions of a housing of an electronic device.

Figure 5A:
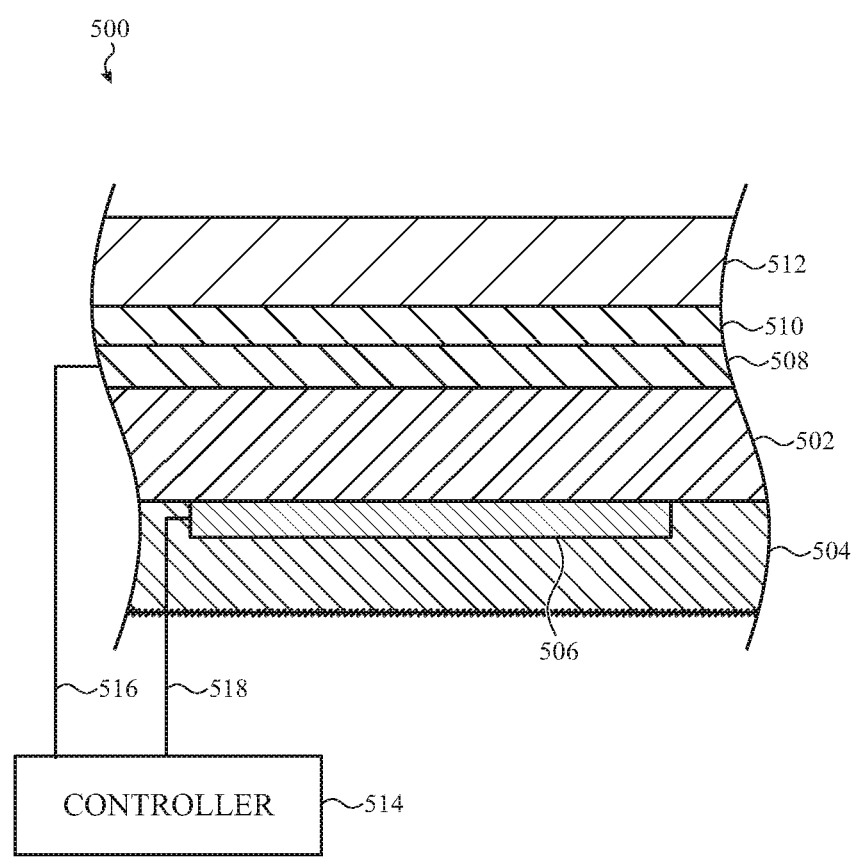
FIG. 5A depicts an example simplified detail view of a thin-film acoustic imaging system, such as described herein (see, e.g., FIG. 1A, taken through section A-A), including a d33 piezoelectric actuator.

FIG. 5A depicts a simplified detail view of a thin-film acoustic imaging system, such as described herein (see, e.g., FIG. 1A, taken through section A-A), including a piezoelectric actuator (as one example, a d33 actuator) formed from a thin film that exhibits a piezoelectric property or response, such as polyvinylidene fluoride (PVDF) or trifluoroethylene (TrFE). IN some cases, the thin film may be formed from a copolymer such as a vinylidene fluoride and trifluoroethylene blend (e.g., PVDF-TrFE). In some cases, a material such as PVDF-TrFE may be selected due at least in part to simplicity of manufacturing and CMOS-compliant annealing temperatures.

In this embodiment, a high impedance stack of layers 500 is shown. The high impedance stack of layers 500 includes a piezoelectric element, identified as the thin-film piezoelectric layer 502, that is configured to expand and contract along a vertical axis (e.g., perpendicular to the lateral contraction/expansion described above with reference to FIGS. 4A-4B). The thin-film piezoelectric layer 502 is supported by an encapsulation layer 504 (which may also be referred to as a metalloid oxide layer, a metal oxide layer, or any other non-conductive insulating layer of material; the layer may be contiguous and/or monolithic or may be formed from multiple layers of material) that encloses a first electrode 506 (which is understood as a portion of a first electrode layer, in array-based acoustic imaging system embodiments) against a bottom surface of the thin-film piezoelectric layer 502.

The encapsulation layer 504, similar to the spacer 408 of FIG. 4B, can be made of a metalloid oxide, such as silicon dioxide. In such embodiments, the encapsulation layer 504 may be referred to as a metalloid oxide layer. The first electrode 506 can be made from a metallic material, such as aluminum. A second electrode 508 (which, as with the first electrode layer is understood as a portion of a second electrode layer, in array-based acoustic imaging system embodiments) is disposed onto a top surface of the thin-film piezoelectric layer 502, and may also be made from a metal material, such as molybdenum. The second electrode 508 may be coupled, via an adhesive/epoxy layer 510, to a lower surface of a sensing plate 512. In other cases, the layer 510 may be or may include a passivation layer, such as SiO2.

As a result of this construction, a controller 514 (which may be a portion of an application-specific integrated circuit, such as described herein) can be conductively coupled to the first electrode 506 and the second electrode 508 via one or more routing traces (such as the traces 516, 518) so that the controller 514 can both drive the thin-film piezoelectric layer 502 and sense electrical signals from the thin-film piezoelectric layer 502.

More specifically, as a result of the depicted construction, a voltage signal (such as a chirp signal or a wavelet) output from the controller 514 can cause a voltage potential difference between the first electrode 506 and the second electrode 508 (polarity and/or frequency content of the voltage may vary from embodiment to embodiment) thereby causing the thin-film piezoelectric layer 502 to vertically expand or contract which, in turn, results in a mechanical deformation of the thin-film piezoelectric layer 502 along a direction perpendicular to a lateral axis, normal to the lower surface of the sensing plate 512, thereby generating an acoustic pulse through the adhesive/epoxy layer 510 that can, thereafter, propagate into the sensing plate 512.

In one specific implementation, the encapsulation layer 504 has a thickness of approximately 2 µm, the first electrode 518 has a thickness of approximately 0.1 µm, the thin-film piezoelectric layer 502 has a thickness of approximately 1.0 µm, the second electrode 412 has a thickness of approximately 0.1 µm, and the adhesive/epoxy layer 416 has a thickness of approximately 3 µm.

These foregoing example thickness are merely illustrative of the relative thickness of the various layers that may be appropriate in certain configurations. In many examples, different thicknesses, including relative thicknesses may be suitable, especially upon consideration of a center frequency output by and received by the controller 514.

As a result of these constructions, a stiffener layer and a backing (which may be a vacuum cavity or other sealed volume) may be eliminated, along with manufacturing complexities and costs associated therewith. In addition, due at least in part to the reduced thickness of the adhesive/epoxy layer, an improved acoustic coupling between the high impedance stack of layers (such as shown in FIG. 5A) and a sensing plate can be achieved.

As noted with respect to other embodiments described herein, each layer depicted and described with reference to FIG. 5A can be manufactured using a thin-film deposition/manufacturing process. In such examples, alignment complexities and other manufacturing challenges related to tolerances can be eliminated.

For example, as noted with respect to other embodiments described herein, a high impedance stack of layers forming an acoustic transducer, such as described herein can be formed along with and/or over an application—specific integrated circuit that, in turn, can be configured to perform, coordinate, trigger, or otherwise execute one or more operations of a controller such as described herein.

Figure 5B:
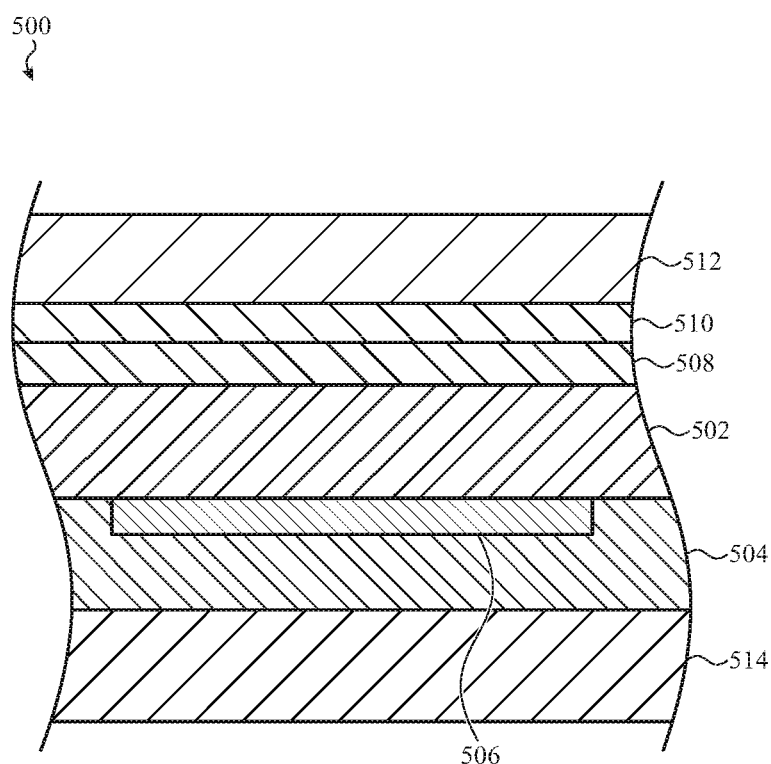
FIG. 5B depicts another example simplified detail view of a thin-film acoustic imaging system, including a d33 piezoelectric actuator formed over an application-specific integrated circuit.

Examples include driving one or more transducers and/or sensing with one or more transducers. For example, FIG. 5B depicts the stack-up as shown in FIG. 5A (the description of which is not repeated herein) formed atop the controller 514, which as noted above may be an application-specific integrated circuit or any other suitable thin-film transistor circuit, pattern of electrical traces, bridges, or pads, or any other suitable analog or digital circuitry.

It may be appreciated that these foregoing example embodiments are not exhaustive of the various constructions of an acoustic imaging system, such as described herein. For example, although a single acoustic element (e.g., piezoelectric element) is depicted in FIGS. 4B-5B, it may be appreciated that an acoustic imaging system such as described herein it typically implemented with multiple discrete and/or physically-separated acoustic transducers arranged in a two-dimensional array, each of which may be conductively coupled to at least a portion of an application-specific integrated circuit configured to initiate drive operations and/or sense operations leveraging said acoustic transducers. In particular, in such embodiments, the array of acoustic transducers may each include two discrete electrodes (e.g., an electrode pair) that can be individually conductively coupled to an application-specific integrated circuit.

In such embodiments, an array of electrode pairs, each of which is associated with a discrete piezoelectric actuator, can be disposed in a grid or matrix pattern, such as described above. In many cases, each electrode of an electrode pair takes the same shape and size, but this is not required; some embodiments include an upper electrode coupled to a top surface of a piezoelectric actuator that is made from a different material, in a different shape, formed to a different thickness, and so on contrasted with a lower electrode coupled to a bottom surface of the same piezoelectric actuator.

More generally and broadly, it may be appreciated that layers described above may be formed form a number of different materials, and/or may be formed in a number of suitable processes. For example, in some cases one or more electrodes of can be aluminum which may be sputtered to a thickness of 100 nm, or a greater thickness or a smaller thickness. In some cases, an adhesion layer may be formed as well to promote electrical and mechanical coupling. Titanium is one example material that may be used as an adhesion layer.

In other cases, other metals may be used for electrodes. In some examples, one electrode may be made from a first material to a first thickness (e.g., Al to 100 nm), and a second electrode can be made from a second material to a second thickness (e.g., Al/Ti to); embodiments and implementations vary.

In some cases, a PVDF-TrFE thin-film layer can be formed by depositing a powder/solvent solution, allowing the solvent to evaporate, and thereafter annealing. In such examples, a PVDF-TrFE layer may be formed to a thickness of approximately 1.5 µm, or less than or greater than the same. Such a layer may be etched into multiple discrete regions by a suitable mechanical, chemical, electrical or other etching process such as reactive ion etching process.

Figure 6:
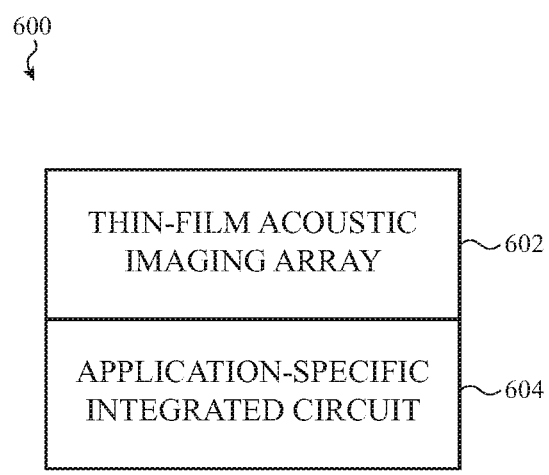
FIG. 6 is an example simplified system diagram of a thin-film acoustic imaging system formed over an application-specific integrated circuit.

As such, generally and broadly, embodiments described herein reference an array of acoustic transducers, formed using a thin-film deposition and/or manufacturing process, that are formed atop an application-specific integrated circuit. FIG. 6 depicts such a construction, showing an acoustic imaging system 600 including a thin-film acoustic imaging array 602 disposed above an application-specific integrated circuit 604.

These foregoing embodiments depicted in FIGS. 4A-6 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Figure 7:
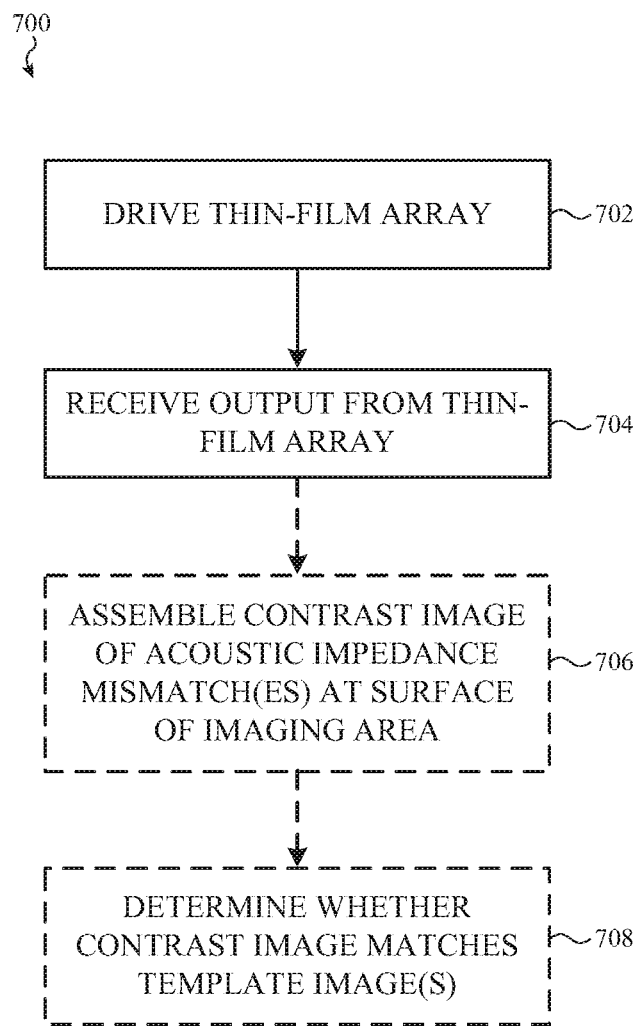
FIG. 7 is a flowchart depicting example operations of a method of operating a thin-film acoustic imaging system, such as described herein.

FIG. 7 is a flowchart depicting example operations of a method of operating a thin-film acoustic imaging system, such as described herein. The method 700 includes operation 702 in which a thin-film array of piezoelectric transducers, such as described herein, is driven by an application-specific integrated circuit (or other controller or equivalent thereof). As noted with respect to other embodiments, driving a piezoelectric transducer can include applying a voltage signal to the transducer, such as a chirp signal or a wavelet. As noted above, the drive operation may cause the acoustic transducers to generate an acoustic pulse into a sensing plate, such as described herein.

The method 700 includes operation 704 at which reflections from an imaging surface of the sensing plate are received. Next, at operation 706 (which, in some embodiments, is optional), an image or acoustic attenuation map may be constructed based on acoustic impedance mismatch boundaries detected at the imaging surface. Finally, at operation 708 (which, in some embodiments, is optional), it may be determined whether the image constructed at operation 708 matches a template image. For example, the image generated at operation 706 may be a fingerprint image and the template image at operation 708 may be a template fingerprint derived from a previously-captured fingerprint image.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the embodiments, whether or not such embodiments are described and whether or not such features are presented as being a part of a described embodiment. Thus, the breadth and scope of the claimed subject matter should not be limited by any of the above-described exemplary embodiments but is instead defined by the claims herein presented.

The present disclosure recognizes that personal information data, including biometric data, in the present technology, can be used to the benefit of users. For example, the use of biometric authentication data can be used for convenient access to device features without the use of passwords. In other examples, user biometric data is collected for providing users with feedback about their health or fitness levels. Further, other uses for personal information data, including biometric data, that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure, including the use of data encryption and security methods that meets or exceeds industry or government standards. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data, including biometric data. That is, the present disclosure contemplates that hardware and/or software elements can be provided to prevent or block access to such personal information data. For example, in the case of biometric authentication methods, the present technology can be configured to allow users to optionally bypass biometric authentication steps by providing secure information such as passwords, personal identification numbers (PINS), touch gestures, or other authentication methods, alone or in combination, known to those of skill in the art. In another example, users can select to remove, disable, or restrict access to certain health-related applications collecting users' personal health or fitness data.

What is claimed is:

1. An acoustic imaging system comprising:
   an adhesive layer configured to acoustically couple to a sensing plate;
   a first electrode layer bonded to the adhesive layer;
   a piezoelectric actuator layer below the first electrode layer;
   a second electrode layer below the piezoelectric actuator layer and aligned with the first electrode layer to generate an electric field through the piezoelectric actuator layer;
   a metalloid oxide layer encapsulating the second electrode layer against the piezoelectric actuator layer; and
   an application-specific integrated circuit formed below and coupled to the metalloid oxide layer, the application-specific integrated circuit conductively coupled to the first electrode layer and the second electrode layer.

2. The acoustic imaging system of claim 1, wherein the piezoelectric actuator layer comprises an array of physically separated piezoelectric actuators.

3. The acoustic imaging system of claim 2, wherein the first electrode layer comprises a set of electrical traces, each terminating at a respective one piezoelectric actuator of the array of physically separated piezoelectric actuators.

4. The acoustic imaging system of claim 3, wherein:
   the set of electrical traces is a first set of electrical traces; and
   the second electrode layer comprise a second set of electrical traces, each terminating at a respective one piezoelectric actuator of the array of physically separated piezoelectric actuators.

5. The acoustic imaging system of claim 1, wherein the metalloid oxide layer comprises silicon dioxide.

6. The acoustic imaging system of claim 1, wherein the first electrode layer comprises molybdenum disposed on a surface of the piezoelectric actuator layer.

7. The acoustic imaging system of claim 6, wherein:
   the surface is a first surface; and the second electrode layer comprises aluminum disposed on a second surface the piezoelectric actuator layer, the second surface opposite the first surface.

8. The acoustic imaging system of claim 7, wherein either or both the first electrode layer or the second electrode layer has a thickness of less than or equal to 0.5 µm.

9. The acoustic imaging system of claim 8, wherein the piezoelectric actuator layer comprises aluminum nitride.

10. The acoustic imaging system of claim 9, wherein:
the thickness is a first thickness; and
the piezoelectric actuator layer has a second thickness of less than or equal to 5 µm.

11. The acoustic imaging system of claim 10, wherein the first thickness is approximately 0.1 µm and the second thickness is approximately 3 µm.

12. The acoustic imaging system of claim 10, wherein the adhesive layer has a third thickness approximately equal to the second thickness.

13. The acoustic imaging system of claim 1, wherein the adhesive layer comprises an epoxy.

14. An acoustic imaging system configured to adhere to an interior surface of a portable electronic device, the acoustic imaging system comprising:
an adhesive layer configured to acoustically couple to the interior surface;
a high acoustic impedance stack comprising:
an actuator layer comprising an array of piezoelectric actuators formed below the adhesive layer;
an array of electrode pairs, each associated with a respective piezoelectric actuator of the actuator layer, each electrode pair comprising:
a first electrode disposed between the adhesive layer a top surface of the respective piezoelectric actuator; and
a second electrode disposed on a bottom surface of the respective piezoelectric actuator opposite and parallel to the first electrode; and
a metalloid oxide layer encapsulating the array of electrode pairs against a second surface of the actuator layer; and
an application-specific integrated circuit formed below and coupled to the metalloid oxide layer of the high acoustic impedance stack, the application-specific integrated circuit conductively coupled to the array of electrode pairs.

15. The acoustic imaging system of claim 14, wherein the application-specific integrated circuit is configured to select at least one electrode pair and generate a voltage between the first electrode of the selected electrode pair and the second electrode of the selected electrode pair to cause the piezoelectric actuator layer to expand or contract and, in response, generate an acoustic pulse with a selected center frequency.

16. The acoustic imaging system of claim 15, wherein the selected center frequency is greater than 40 MHz.

17. The acoustic imaging system of claim 16, wherein the selected center frequency is approximately 50 MHz.

18. The acoustic imaging system of claim 15, wherein the voltage is a wavelet pulse having the selected center frequency.

19. The acoustic imaging system of claim 14, wherein at least one of the piezoelectric actuators comprises a d33 piezoelectric crystal material configured to expand or contract along a direction separating the first electrode and the second electrode.

20. The acoustic imaging system of claim 14, wherein the interior surface is defined by a portion of a housing an electronic device.

21. The acoustic imaging system of claim 20, wherein the portion of the housing comprises one of:
an active display area;
a housing surface; or
a housing sidewall.

22. An electronic device comprising an acoustic imaging system, the electronic device comprising:
a housing; and
the acoustic imagining system comprising:
an adhesive layer configured to acoustically couple to an internal surface of the housing, thereby defining a portion of an external surface of the housing opposite the internal surface as an imaging surface;
a first electrode layer bonded to the adhesive layer;
a piezoelectric actuator layer below the first electrode layer;
a second electrode layer below the piezoelectric actuator layer aligned with the first electrode layer to generate an electric field through the piezoelectric actuator layer;
a metalloid oxide layer encapsulating the second electrode against the piezoelectric actuator layer; and
an application-specific integrated circuit formed below and coupled to the metalloid oxide layer, the application-specific integrated circuit conductively coupled to the first electrode layer and the second electrode layer and configured to:
apply a first voltage signal between the first electrode layer and the second electrode layer to cause an acoustic pulse to be generated by the piezoelectric actuator layer, the acoustic pulse propagating toward the imaging surface through the housing; and
receive a second voltage signal from at least one of the first electrode layer or the second electrode layer after generating the acoustic pulse.

23. The electronic device of claim 22, further comprising a display; wherein the imaging surface is above an active display area of the display.

24. The electronic device of claim 22, wherein the imaging surface is a sidewall surface of the housing.

25. The electronic device of claim 22, wherein the imaging surface has a curved profile.

* * * * *